(12) United States Patent
Watanabe

(10) Patent No.: US 12,088,315 B2
(45) Date of Patent: Sep. 10, 2024

(54) ANALOG-TO-DIGITAL CONVERTER

(71) Applicant: DENSO CORPORATION, Kariya (JP)

(72) Inventor: Takamoto Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 169 days.

(21) Appl. No.: 17/949,322

(22) Filed: Sep. 21, 2022

(65) Prior Publication Data

US 2023/0093133 A1   Mar. 23, 2023

(30) Foreign Application Priority Data

Sep. 22, 2021   (JP) ................................. 2021-154356

(51) Int. Cl.
*H03M 1/12* (2006.01)
*H03M 1/06* (2006.01)
*H03M 1/60* (2006.01)

(52) U.S. Cl.
CPC ........ *H03M 1/1245* (2013.01); *H03M 1/0609* (2013.01); *H03M 1/12* (2013.01); *H03M 1/60* (2013.01)

(58) Field of Classification Search
CPC .... H03M 1/1245; H03M 1/12; H03M 1/0609; H03M 1/60
See application file for complete search history.

(56) References Cited

U.S. PATENT DOCUMENTS

| 2003/0201927 | A1  | 10/2003 | Watanabe et al. |
| 2007/0096836 | A1* | 5/2007  | Lee ......................... H03L 7/085 331/57 |

\* cited by examiner

*Primary Examiner* — Joseph J Lauture
(74) *Attorney, Agent, or Firm* — Posz Law Group, PLC

(57) ABSTRACT

In an analog-to-digital converter, primary latches respectively latch an output of a corresponding one of delay units at respective sample times of different first clocks. The primary latches include at least first and second primary latches, and secondary latches include at least first and second secondary latches respectively corresponding to the at least first and second primary latches. Each of the at least first and second secondary latches is configured to latch, at a sample time of a common second clock, an output of a corresponding one of the at least first and second primary latches. The common second clock is based on at least one of the first clocks.

7 Claims, 11 Drawing Sheets

US 12,088,315 B2

ANALOG-TO-DIGITAL CONVERTER

CROSS-REFERENCE TO RELATED APPLICATION

This application is based on and claims the benefit of priority from earlier Japanese Patent Application No. 2021-154356 filed on Sep. 22, 2021, the entire disclosure of which is incorporated herein by reference.

TECHNICAL FIELD

The present disclosure relates to analog-to-digital (A/D) converters for converting an input analog signal into digital numeric data.

BACKGROUND

A/D converters have been being developed to simplify their configurations with higher-resolution digital data, i.e., higher-resolution digital numeric data.

SUMMARY

An analog-to-digital converter according to an aspect of the present disclosure is configured such that primary latches respectively latch an output of a corresponding one of delay units at respective sample times of different first clocks. The primary latches include at least first and second primary latches, and secondary latches include at least first and second secondary latches respectively corresponding to the at least first and second primary latches. Each of the at least first and second secondary latches is configured to latch, at a sample time of a common second clock, an output of a corresponding one of the at least first and second primary latches. The common second clock is based on at least one of the first clocks.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENTS

Figure 1:
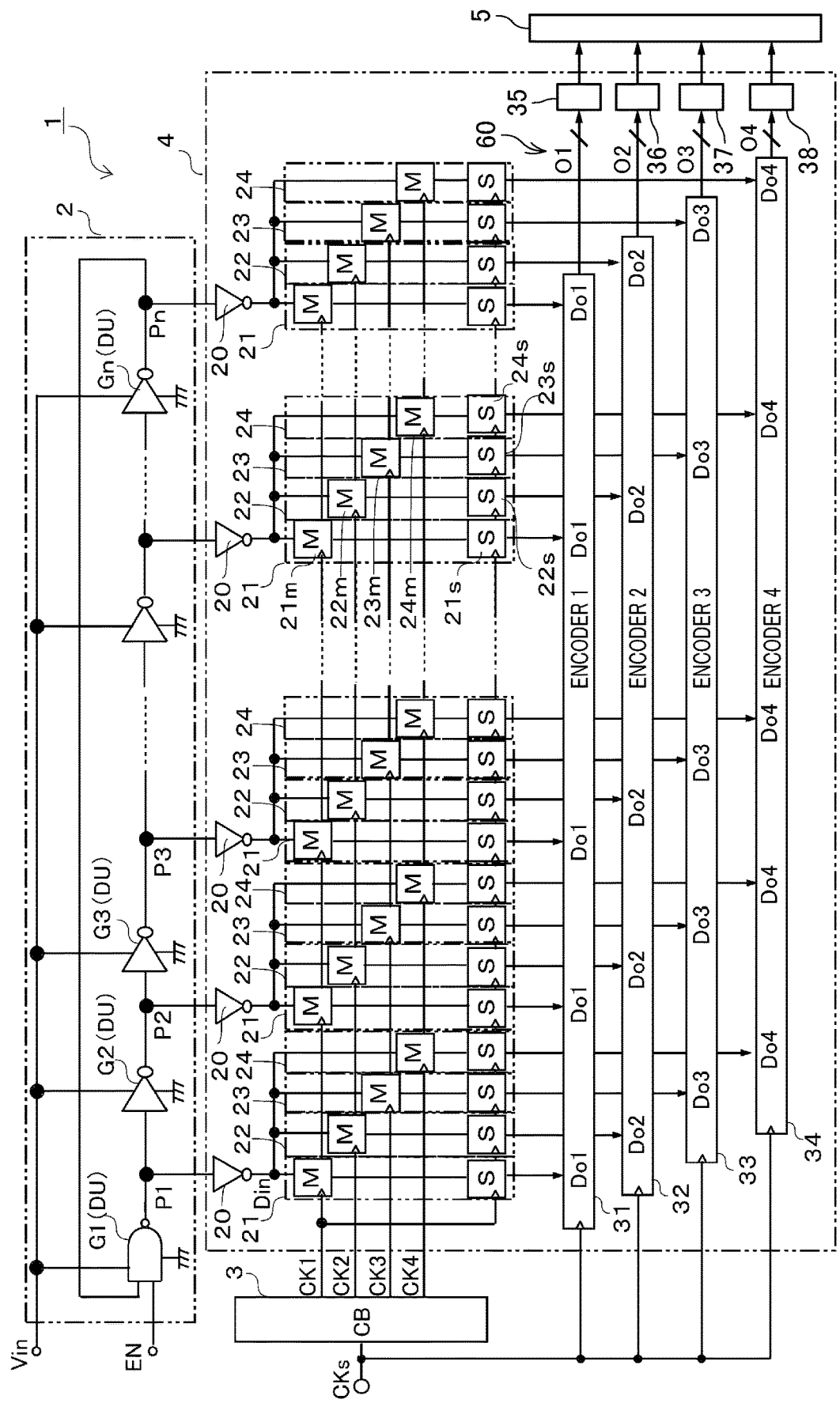
FIG. 1 is a block diagram illustrating a schematic configuration of an A/D converter according to a first embodiment of the present disclosure.

An example of such an analog-to-digital converter is disclosed in Japanese Patent Application Publication No. 2004-007385.

An A/D converter disclosed in the patent publication includes a pulse delay circuit comprised of a plurality of delay units that are connected in a ring-like cascade structure to each other; each of the delay units includes various gate circuits. The plurality of delay units correspond to a plurality of stages of delay.

An analog input signal, i.e., an analog input voltage, which is an A/D conversion target, is configured to be supplied to each delay unit as a power supply voltage. This offers an A/D converter with time-domain processing.

The A/D converter disclosed in the patent publication is configured such that a pulse signal inputted to one of the delay units is sequentially transferred through the delay units while being delayed thereby. When the pulse signal is transferred through each delay unit, a transfer speed of the pulse signal through the corresponding delay unit is determined based on ya delay time of the pulse signal through the corresponding delay unit; the delay time of the pulse signal through each delay unit depends on the power supply voltage for the corresponding delay unit.

Counting the number of stages, i.e., delay units, in the plurality of delay units through which the pulse signal has passed during a predetermined sample period enables the analog input voltage to be converted into digital numeric data. Specifically, such an A/D converter disclosed in the patent publication is called a Time-A/D converter with Clock-Edge-Shift construction (CKES), which can be abbreviated as "a CKES-TAD".

Such an A/D converter, an example of which is disclosed in the patent publication, is configured as an integrated-circuit (IC) chip, and includes m, such as four, pulse position digitizers, each of which is comprised of a latch and an encoder. To the respective latches of the m pulse position digitizers, m clock pulses, i.e., four clock pulses, are inputted.

The latch of each pulse position digitizer is connected to the respective delay units through respective delay-unit wirings, and latches outputs of the respective delay units through the respective readout wirings synchronously with the timing of the positive edge (rising edge) or negative edge (falling edge) of the corresponding one of the m clock pulses.

The encoder of each pulse position digitizer converts a position at which the pulse signal inputted to the first stage of the delay units has reached into digital data, i.e., digital numerical data.

Inventors of the present disclosure have been considering a primary/secondary latch circuit, which is comprised of plural pairs of primary and secondary latches, as a latch for inputting, to each encoder, the position at which the pulse signal inputted to the first stage of the delay units has reached.

This consideration needs input wirings for inputting the clock pulses to the respective primary latches, and additional input wirings for inputting the clock pulses to the respective secondary latches. This therefore may result in an increase in the number of input wirings for the clock pulses, resulting in an increase in a footprint of the primary/secondary latch circuit in a component layout space in the IC-chip A/D converter.

An increase in a footprint of the primary/secondary latch circuit in the component layout space in the IC-chip A/D converter may cause an increase in each of the delay-unit wirings, resulting in parasitic impedance, such as parasitic capacitance and/or parasitic resistance, in each delay-unit wiring becoming larger. This may cause the rising time of an input waveform, which represents the output of each delay unit, to the latch of each pulse position digitizer to increase, causing the primary/secondary latch circuit to have unstable operations.

An increase in a footprint of the primary/secondary latch circuit in the component layout space in the IC-chip A/D converter may inhibit performance improvement of the A/D converter, which has been accomplished by ever finer CMOS fabrication processes.

From this viewpoint, the present disclosure aims to provide A/D converters, each of which includes a primary/secondary latch circuit with a smaller footprint in a component layout space in the corresponding one of the A/D converters.

An exemplary measure according to the present disclosure provides an analog-to-digital converter. The analog-to-digital converter includes a pulse delay circuit that includes a plurality of delay units connected in series to one another. The pulse delay circuit is configured to transfer a pulse signal therethrough while the pulse signal is delayed by each of the plurality of delay units. A delay time of each of the plurality of delay units depends on a level of an analog input signal being input to each of the plurality of delay units. The analog-to-digital converter includes a plurality of latch modules provided for each of the delay units. Each of the latch modules provided for each of the delay units includes a plurality of primary latches configured to respectively latch an output of the corresponding one of the delay units at respective sample times of different first clocks. Each of the latch modules provided for each of the delay units includes a plurality of secondary latches for latching outputs of the respective primary latches. The plurality of secondary latches include at least first and second secondary latches, and the plurality of primary latches include at least first and second primary latches respectively corresponding to the at least first and second secondary latches. Each of the at least first and second secondary latches is configured to latch, at a sample time of a common second clock, the output of a corresponding one of the at least first and second primary latches. The common second clock is based on at least one of the first clocks. The analog-to-digital converter includes an encoder unit configured to encode an output data item outputted from each of the plurality of secondary latches into a digital numeric data item.

The plurality of latch modules are provided for each of the delay units of the pulse delay circuit inhibit an increase in both a footprint of the A/D converter and power consumption by the A/D converter without an increase in the number of pulse delay circuits or the number of delay units in the delay units.

In particular, each of the at least first and second secondary latches is configured to latch, at the sample time of the common second clock, the output of a corresponding one of the at least first and second primary latches; the common second clock being based on at least one of the first clocks.

This enables the at least first and second secondary latches to share the second clock, resulting in a reduction in the number of wirings for supplying the second clock to the respective secondary latches. This results in a smaller footprint of the latch modules in the component layout space in the A/D converter.

The following describes exemplary embodiments of the present disclosure with reference to the accompanying drawings. In the exemplary embodiments, like parts between the embodiments, to which like reference characters are assigned, are omitted or simplified to avoid redundant description.

First Embodiment

The following describes a time-based A/D converter (time to analog to digital converter) 1 according to the first embodiment with reference to FIGS. 1 to 7. FIGS. 1 to 5 schematically illustrate an example of the configuration of the time-based A/D converter 1.

The time-based A/D converter 1, which will be referred to as an A/D converter 1, can be installed in various analog and digital fusion devices and/or systems, such as sensor devices having a digital communication function, system-on-chips for, for example, 5G communication devices, and semiconductor ICs for systems using Internet on Things (IoT). For example, the A/D converter 1 can be manufactured using Complementary Metal-Oxide-Semiconductor (CMOS) fabrication processes.

Figure 3:
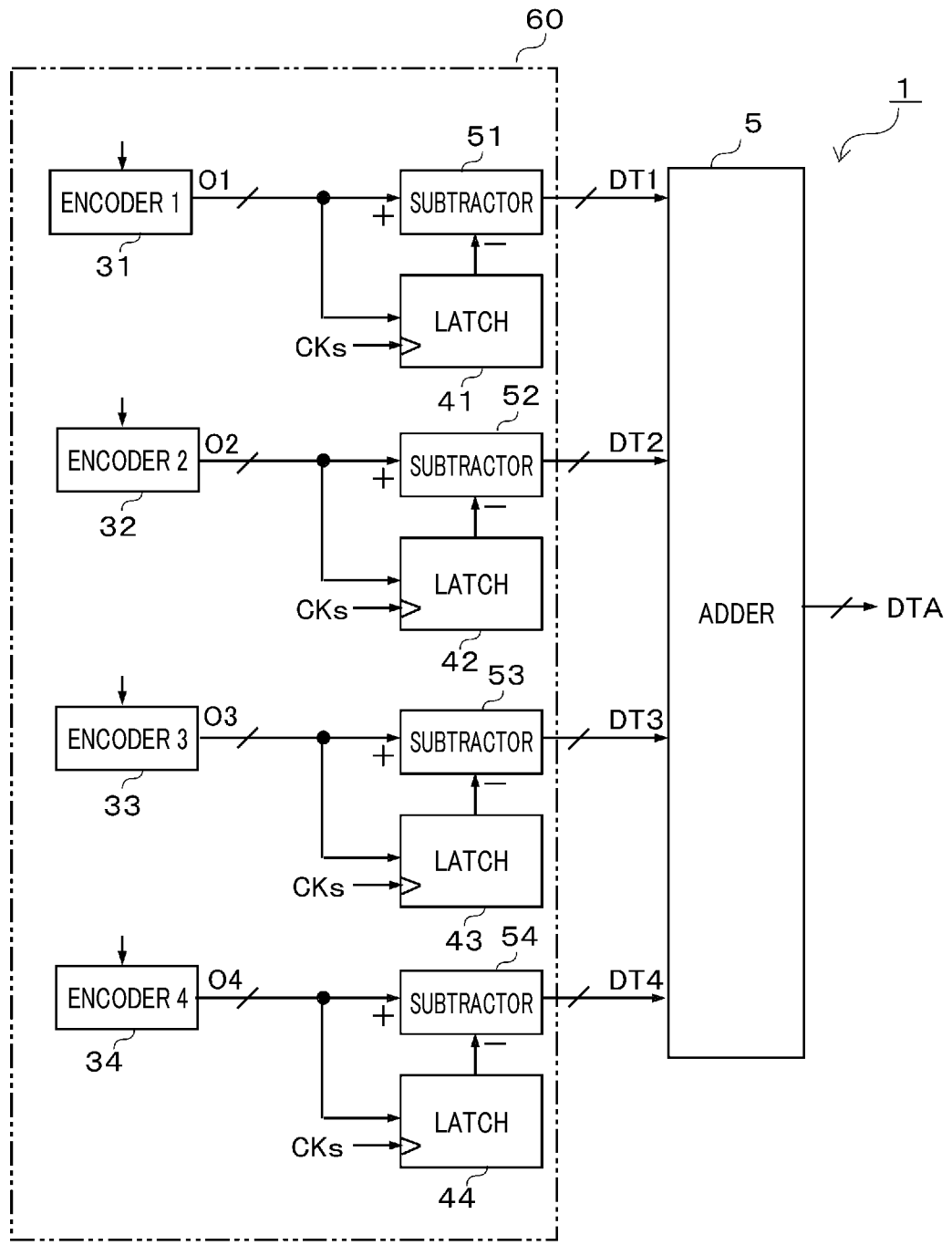
FIG. 3 is an electrical and block diagram illustrating a schematic configuration of an encoder unit of the A/D converter illustrated in FIG. 1.

Referring to FIGS. 1 and 3, the A/D converter 1 includes a pulse delay circuit 2, a clock generator 3, a pulse position digitizing circuit 4, and an adder 5. The A/D converter 1 is configured to receive an analog input voltage signal Vin, which is outputted from any device outputting an analog voltage signal, such as a sensor, and convert the analog input voltage signal Vin into a digital numeric data item DTA. The pulse position digitizing circuit 4 will also be referred to as a latch-encoder and subtractor.

Configuration of Pulse Delay Circuit

Next, the following describes an example of the configuration of the pulse delay circuit 2.

The pulse delay circuit 2 is comprised of n delay units DU connected in series to one another in a ring form; the number n of delay units DU serves as the number n of stages of delay. The pulse delay circuit 2 will also be referred to as a ring delay line. The number n is set to an odd number of, for example, 15.

The delay unit DU serving as the first stage of delay, which will also be referred to as a first delay unit, is comprised of a NAND gate G1, and the remaining delay units DU serving as the second to nth delay units DU, i.e., the second to nth stages of delay, are respectively comprised of NOT gates G2 to Gn, i.e., inverters G2 to Gn. That is, these first to nth delay units can be referred to as G1 to Gn or DU.

The first delay unit (NANG gate) G1 has first and second input terminals and an output terminal, and a pulse signal is input to the first input terminal of the first delay unit G1.

Each of the second to nth delay units G2 to Gn has an input terminal and an output terminal.

The input terminal of each delay unit G2, . . . , Gn except for the first delay unit G1 is cascade-connected to the output terminal of the immediately previous stage delay unit G1, . . . , Gn−1. The output terminal of the last nth stage delay unit Gn is connected to the second input terminal of the first delay unit G1.

When the pulse signal is input to the first input terminal of the first delay unit G1, the first delay unit G1 works to transfer the pulse signal to the next delay unit G2 while delaying the pulse signal by a predetermined time of delay Td.

Each of the remaining delay units G2 to Gn−1 except for the last delay unit Gn sequentially transfers the pulse signal transferred from the immediately previous delay unit to the next delay unit while delaying the pulse signal by the predetermined time of delay Td. The last delay unit Gn transfers the pulse signal transferred from the immediately previous delay unit to the next first delay unit G1 while delaying the pulse signal by the predetermined time of delay Td.

The output terminals of the respective delay units G1 to Gn are also connected to the pulse position digitizing circuit 4, so that the pulse signal outputted from each of the delay units G1 to Gn is inputted to the pulse position digitizing circuit 4.

The analog input voltage signal Vin is inputted to each of the delay units G1 to Gn as a power supply voltage, so that the power supply voltage inputted to each of the delay units G1 to Gn activates the corresponding one of the delay units G1 to Gn.

Each delay unit DU is configured such that an operating time of the corresponding delay unit DU depends on the level of the analog input voltage signal Vin, this resulting in the delay time of each delay unit DU depending on the level of the analog input voltage signal Vin.

Any gate, whose delay time Td depends on the level of the analog input voltage signal Vin, can be used as each of the delay units DU. As illustrated in FIG. 1, it is preferable that a NAND gate and NOT gates are used for the respective delay units DU as illustrated in FIG. 1.

For example, each of the NOT gates G2 to Gn is comprised of a single-stage CMOS inverter with a simpler circuit configuration and a smaller delay time Td with higher time resolution.

Change of the level of the pulse signal EN from a low level to a high level causes the output of each of the odd-stage delay units DU, i.e., the NAND gate G1 and the NOT gates G3, G5, . . . to be changed from the high level to the low level, and the output of each of the even-stage delay units DU, i.e., the NOT gates G2, G4, . . . to be changed from the low level to the high level.

Because the odd number, which is for example 15, of the delay units DU are cascade-connected to have a loop, the pulse signal is circulated through the looped delay units DU while the rising timing of the pulse signal from the low level to the high level and the falling riming of the pulse signal from the high level to the low level are alternately transferred in the looped delay units DU.

Because the delay time of each delay unit DU depends on the level of the analog input voltage signal Vin, changing the level of the analog input voltage signal Vin enables the circulating speed of the pulse signal to be changed.

Configuration of Clock Generator

Figure 2:
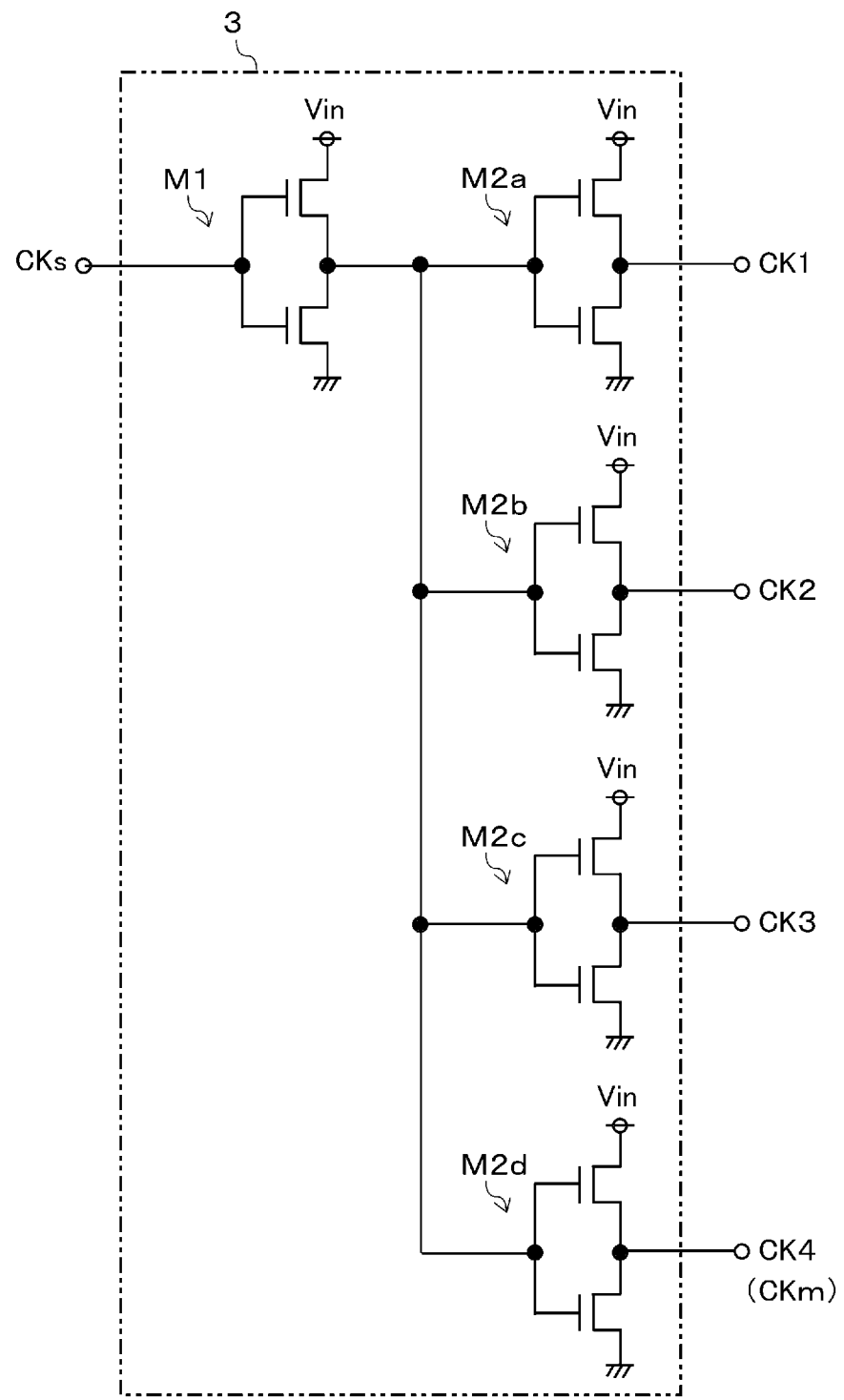
FIG. 2 is an electrical circuit diagram illustrating a schematic configuration of a clock generator of the A/D converter illustrated in FIG. 1.

The clock generator 3 is, as illustrated in FIG. 2, comprised of a CMOS inverter M1, and m CMOS inverters M2$a$1 to M2$am$ connected in parallel to each other; the CMOS inverter M1 serves as the first stage, and the parallelly connected CMOS inverters M2$a$1 to M2$am$ serves as the second stage and are subsequently connected to the CMOS inverter M1. Each of the CMOS inverters M2$a$1 to M2$am$ is configured to output a corresponding one of sampling clocks CK1 to CKm; each sampling clock CK1, . . . , CKm is a sequence of pulses, i.e., clock pulses. The sampling clocks CK1 to CKm will be simply referred to as clocks CK1 to CKm.

The first embodiment uses four CMOS inverters M2$a$1 to M2$a$4 (m=4), so that the four clocks CK1 to CK4 are outputted from the respective CMOS inverters M2$a$1 to M2$a$4.

Each of the CMOS inverters M1, and M2$a$1 to M2$a$4 is comprised of a P-channel MOS transistor and an N-channel MOS transistor. The gate of the P-channel MOS transistor and the gate of the N-channel MOS transistor of each of the CMOS inverters M1, and M2$a$1 to M2$a$4 are commonly connected to one another to form an input terminal of the corresponding one of the CMOS inverters M1, and M2$a$1 to M2$a$4. The drain of the P-channel MOS transistor and the drain of the N-channel MOS transistor of each of the CMOS inverters M1, and M2$a$1 to M2$a$4 are commonly connected to one another to form an output terminal of the corresponding one of the CMOS inverters M1, and M2$a$1 to M2$a$4. The analog input voltage signal Vin is inputted as a power supply voltage, to the source of the P-channel MOS transistor of each of the CMOS inverters M1, and M2$a$1 to M2$a$4. Additionally, the source of the N-channel MOS transistor of each of the CMOS inverters M1, and M2$a$1 to M2$a$4 is connected to a ground terminal thereof.

The input terminals of the second-stage CMOS inverters M2$a$1 to M2$a$4 are commonly connected to the output terminal of the first-stage CMOS inverter M1, and a sampling clock reference signal CKs is inputted to the input terminal of the first-stage CMOS inverter M1 as a reference clock, i.e., a master clock. That is, the sampling clock reference signal CKs serves as a main clock externally inputted to the input terminal of the first-stage MOS inverter M1.

That is, each pulse of the sampling clock reference signal CKs is inputted to the input terminal of the first-stage MOS inverter M1.

The first-stage MOS inverter M1 receives each pulse of the sampling clock reference signal CKs inputted thereto, and transfers each pulse of the sampling clock reference signal CKs to each of the second-stage inverters M2$a$1, M2$a$2, M2$a$3, and M2$a$4.

Each of the second-stage inverters M2$a$1, M2$a$2, M2$a$3, and M2$a$4 receives each pulse of the sampling clock reference signal CKs, and transfers each pulse of the sampling clock reference signal CKs as each pulse of the corresponding one of the clocks CK1 to CKm(CK4).

In particular, each of the CMOS inverters M2$a$1 to M2$a$4 has a first length and a first width of the gate of the corresponding PMOS transistor and a second length and a second width of the gate of the corresponding NMOS transistor. The first length of the gate of the PMOS transistor of any one of the CMOS inverters M2$a$1 to M2$a$4 is set to be different from that of the gate of the PMOS transistor of another of the CMOS inverters M2$a$1 to M2$a$4. Similarly, the first width of the gate of the PMOS transistor of any one of the CMOS inverters M2$a$1 to M2$a$4 is set to be different from that of the gate of the PMOS transistor of another of the CMOS inverters M2$a$1 to M2$a$4.

Additionally, the second length of the gate of the NMOS transistor of any one of the CMOS inverters M2a1 to M2a4 is set to be different from that of the gate of the NMOS transistor of another of the CMOS inverters M2a1 to M2a4. Similarly, the second width of the gate of the NMOS transistor of any one of the CMOS inverters M2a1 to M2a4 is set to be different from that of the gate of the NMOS transistor of another of the CMOS inverters M2a1 to M2a4.

This enables the positive edge (rising edge) of the clock CK1 to delay relative to the positive edge of the sampling clock reference signal CKs by a predetermined delay ΔTs (CK1−CKs).

Similarly, the positive edge of the clock CK2 to delay relative to the positive edge of the sampling clock reference signal CKs by a predetermined delay ΔTs(CK2−CKs), the positive edge of the clock CK3 to delay relative to the positive edge of the sampling clock reference signal CKs by a predetermined delay ΔTs(CK3−CKs), and the positive edge of the clock CK4 to delay relative to the positive edge of the sampling clock reference signal CKs by a predetermined delay ΔTs(CK4−CKs).

The delay ΔTs(CK1−CKs), the delay ΔTs(CK2−CKs), the delay ΔTs(CK3−CKs), and the delay ΔTs(CK4−CKs) are set to be different from one another. In particular, the delay ΔTs(CK1−CKs), the delay ΔTs(CK2−CKs), the delay ΔTs(CK3−CKs), and the delay ΔTs(CK4−CKs) are set to be longer in this order, which can be represented as the expression ΔTs(CK1−CKs)<ΔTs(CK2−CKs)<ΔTs (CK3−CKs) <ΔTs (CK4−CKs).

The period Ts of each clock CK1, CK2, CK3, and CK4, which is set to be equal to the period Ts of the sampling clock reference signal CKs, is set to be longer than the delay time Td of each delay unit DU. For example, the period of each clock CK1, CK2, CK3, and CK4 is set to a constant period that is several times longer than the delay time Td of each delay unit DU. Each adjacent pair of the clocks CK1, CK2, CK3, and CK4 has a phase difference Δt (see FIG. 6), and the product of m (=4 in this embodiment) and Δt, which is expressed as 4Δt, is set to be substantially equal to the delay time Td of each delay unit DU.

That is, the delay ΔTs(CK1−CKs) of the positive edge of the clock CK1 relative to that of the sampling clock reference signal CKs can be expressed by 1×Δt, and the delay ΔTs(CK2−CKs) of the positive edge of the clock CK2 relative to that of the sampling clock reference signal CKs can be expressed by 2×Δt.

Similarly, the delay ΔTs(CK3−CKs) of the positive edge of the clock CK3 relative to that of the sampling clock reference signal CKs can be expressed by 3×Δt, and the delay ΔTs(CK4−CKs) of the positive edge of the clock CK4 relative to that of the sampling clock reference signal CKs can be expressed by 4×Δt.

Configuration of Pulse Position Digitizing Circuit

The pulse position digitizing circuit 4 is, as illustrated in FIGS. 1 and 3, comprised of NOT gates 20, latch modules 21 to 24 provided for each delay unit DU, and an encoder unit 60. The encoder unit 60 is, as illustrated in FIG. 3, encoders 31 to 34 and latch-subtractor modules 50, and each of the latch-subtractor modules 35 to 38 is comprised of subtractors 51 to 54 and latches 41 to 44.

The number of the NOT gates 20 illustrated in FIG. 1 is set to n, so that the n NOT gates 20 are respectively provided for the n delay units DU. Specifically, each n NOT gate 20 has an input terminal and an output terminal, and the input terminals of the n NOT gates 20 are connected to the output terminals of the n delay units DU, respectively. Outputs P1 to Pn of the n delay units DU are therefore inputted to the respective n NOT gates 20.

The latch modules 21 to 24 are configured as n sets of latch modules 21 to 24 provided for the respective n delay units DU, i.e., n NOT gate.

The latch modules 21 to 24 of each set have input terminals and output terminals. The input terminals of the latches 21 to 24 of each set are commonly connected to the output terminal of the corresponding NOT gate 20. That is, the number of sets of the latch modules 21 to 24 is identical to the number of outputs P1 to Pn of the respective delay units DU.

The number of latch modules 21 to 24 is identical to the number of clocks CK1 to CK4.

To the latch modules 21 to 24 provided for each delay unit DU, the clocks CK1, CK2, CK3, and CK4 are inputted.

Let us focus the four latch modules 21 to 24, which are parallelly provided for the output P1 of the first delay units DU (G1), is configured to latch the output P1 in synchronization with the positive or negative edge of each pulse of the corresponding one of the clocks CK1 to CK4.

The clocks CK1, CK2, CK3, and CK4 have the respective phase differences 1×Δt, 2×Δt, 3×Δt, and 4×Δt relative to the sampling clock reference signal CKs. For this reason, the latch module 21 latches the output P1 at the sample time corresponding to the occurrence of each pulse, such as the occurrence of the positive edge or negative edge of each pulse, of the clock CK1, which corresponds to the timing 1×Δt relative to the corresponding pulse of the sampling clock reference signal CKs. Similarly, the latch module 22 latches the output P1 at the sample time corresponding to the occurrence of each pulse of the clock CK2, which corresponds to the timing 2×Δt relative to the sampling clock reference signal CKs. The latch module 23 latches the output P1 at the sample time corresponding to the occurrence of each pulse of the clock CK3 corresponding to the timing 3×Δt relative to the sampling clock reference signal CKs. The latch module 24 latches the output P1 at the sample time corresponding to the occurrence of each pulse of the clock CK4 corresponding to the timing 4×Δt relative to the sampling clock reference signal CKs.

Note that the occurrence of a pulse represents the occurrence of the positive edge or the negative edge of the pulse.

The phase difference Δt between each adjacent pair of the clocks CK1, CK2, CK3, and CK4 is set to Td/m (m=4 in this embodiment), making it possible to latch the output P1 at each of the subdivided sampling times 1×(Td/4), 2×(Td/4), 3×(Td/4), and 4×(Td/4); each of the subdivided sampling times 1×(Td/4), 2×(Td/4), 3×(Td/4), and 4×(Td/4) is a function of the value (Td/4) obtained by subdividing the delay time Td of each delay unit DU.

This configuration of the pulse position digitizing circuit 4 enables the parallelly arranged latch modules 21 to 24 for the first delay unit DU (G1) to latch the output P1 of the first delay unit DU (G1) through the NOT gate 20 at the sample times corresponding to the respective pulses of the different clocks CK1, CK2, CK3, and CK4.

Similarly, this configuration of the pulse position digitizing circuit 4 enables the parallelly arranged latch modules 21 to 24 for the second delay unit DU (G2) to latch the output P2 of the second delay unit DU (G2) through the NOT gate 20 at the sample times corresponding to the respective pulses of the different clocks CK1, CK2, CK3, and CK4, . . . , and the parallelly arranged latch modules 21 to 24 for the nth delay unit DU (Gn) to latch the output Pn of the nth delay unit DU (Gn) through the NOT gate 20 at the sample times corresponding to the respective pulses of the different clocks CK1, CK2, CK3, and CK4.

The pulse position digitizing circuit 4 according to the first embodiment therefore has higher time resolution without an increase in the number of pulse delay circuits and in the number n of the delay units DU in the pulse delay circuit 2.

As described above, the latch modules 21 to 24 for each of the n delay units DU are configured to latch the output of the corresponding one of the delay units DU through the NOT gate 20.

Each of the latch modules 21 that are provided for the respective delay units DU is comprised of a primary latch 21*m* and a secondary latch 21*s* connected in series to one another, and the primary latches 21*m* provided for the respective delay units DU are cascade-connected to each other, and the secondary latches 21*s* provided for the respective delay units DU are cascade-connected to each other.

Similarly, each of the latch modules 22 that are provided for the respective delay units DU is comprised of a primary latch 22*m* and a secondary latch 22*s* connected in series to one another, and the primary latches 22*m* provided for the respective delay units DU are cascade-connected to each other, and the secondary latches 22*s* provided for the respective delay units DU are cascade-connected to each other.

Like the latch modules 22, each of the latch modules 23 that are provided for the respective delay units DU is comprised of a primary latch 23*m* and a secondary latch 23*s* connected in series to one another, and the primary latches 23*m* provided for the respective delay units DU are cascade-connected to each other, and the secondary latches 23*s* provided for the respective delay units DU are cascade-connected to each other.

Additionally, each of the latch modules 24 that are provided for the respective delay units DU is comprised of a primary latch 24*m* and a secondary latch 24*s* connected in series to one another, and the primary latches 24*m* provided for the respective delay units DU are cascade-connected to each other, and the secondary latches 24*s* provided for the respective delay units DU are cascade-connected to each other.

That is, the latch modules 21 to 24 for the first delay unit DU (G1) are configured to latch the state of the delayed pulse P1 outputted from the first delay unit DU (G1) through the NOT gate 20 at the sample times corresponding to the respective pulses of the different clocks CK1, CK2, CK3, and CK4, . . . , and the latch modules 21 to 24 for the nth delay unit DU (Gn) are configured to latch the state of the delayed pulse Pn outputted from the nth delay unit DU (Gn) through the NOT gate 20 at the sample times corresponding to the respective pulses of the different clocks CK1, CK2, CK3, and CK4.

In particular, the primary latches 21*m* to 24*m* for the first delay unit DU (G1) are configured to latch the state of the delayed pulse P1 outputted from the first delay unit DU (G1) through the NOT gate 20 at the sample times corresponding to the respective pulses of the different clocks CK1, CK2, CK3, and CK4, . . . , and the primary latches 21*m* to 24*m* for the nth delay unit DU (Gn) are configured to latch the state of the delayed pulse Pn outputted from the nth delay unit DU (Gn) through the NOT gate 20 at the sample times corresponding to the respective pulses of the different clocks CK1, CK2, CK3, and CK4. Each of the clocks CK1 to CK4 serves as a first clock.

In contrast, the secondary latches 21*s* to 24*s* for the first delay unit DU (G1) are configured to latch the state of the delayed pulse P1 outputted from the first delay unit DU (G1) through the NOT gate 20 at the sample time corresponding to the occurrence of each pulse of the clock CK1, . . . , and the secondary latches 21*s* to 24*s* for the nth delay unit DU (Gn) are configured to latch the state of the delayed pulse Pn outputted from the nth delay unit DU (Gn) through the NOT gate 20 at the sample time corresponding to the occurrence of each pulse of the clock CK1.

That is, the secondary latches 21*s* to 24*s* for each of the n delay units DU are configured to latch the output of the corresponding one of the delay units DU through the NOT gate 20 at the sample time corresponding to the occurrence of each pulse of the clock CK1 included in the clocks CK1 to CK4. The clock CK1 used by each of the secondary latches 21*s* to 24*s* serve as a second clock. One of specific examples of the latch modules 21 to 24 will be described later.

The number of encoders 31 to 34 is identical to the number of clock pulses CK1 to CK4. That is, the four encoders 31 to 34 are provided in the pulse position digitizing circuit 4.

The encoder 31 is configured to encode output data items Do1 latched by the respective latch modules 21 into code data, i.e., z-bit data, O1 in synchronization with the occurrence of each pulse of the sampling clock reference signal CKs (z is 2').

The data item latched by each of the latch modules 21 corresponds to the output of the corresponding one of the delay units DU, so that any one of the data items, which corresponds to the delay unit DU at which the circulated pulse signal inputted to the ring delay line has arrived, is a specified value other than the data items corresponding to the remaining other delay units DU. This therefore makes it possible to digitize a position at which the circulated pulse signal inputted to the ring delay line has arrived in the ring delay line to thereby generate the z-bit data O1.

The encoder 32 is configured to encode data items Do2 latched by the respective latch modules 22 into code data, i.e., z-bit data, O2 in synchronization with the occurrence of each pulse of the sampling clock reference signal CKs. The data item latched by each of the latch modules 22 corresponds to the output of the corresponding one of the delay units DU, so that any one of the data items, which corresponds to the delay unit DU at which the circulated pulse signal inputted to the ring delay line has arrived, is a specified value other than the data items corresponding to the remaining other delay units DU. This therefore makes it possible to digitize a position at which the circulated pulse signal inputted to the ring delay line has arrived in the ring delay line to thereby generate the z-bit data O2.

The encoder 33 is configured to encode data items Do3 latched by the respective latch modules 23 into code data, i.e., z-bit data, O3 in synchronization with the occurrence of each pulse of the sampling clock reference signal CKs. The data item latched by each of the latch modules 23 corresponds to the output of the corresponding one of the delay units DU, so that any one of the data items, which corresponds to the delay unit DU at which the circulated pulse signal inputted to the ring delay line has arrived, is a specified value other than the data items corresponding to the remaining other delay units DU. This therefore makes it possible to digitize a position at which the circulated pulse signal inputted to the ring delay line has arrived in the ring delay line to thereby generate the z-bit data O3.

The encoder 34 is configured to encode data items Do4 latched by the respective latch modules 24 into code data, i.e., z-bit data, O4 in synchronization with the occurrence of each pulse of the sampling clock reference signal CKs. The data item latched by each of the latch modules 24 corresponds to the output of the corresponding one of the delay units DU, so that any one of the data items, which corresponds to the delay unit DU at which the circulated pulse signal inputted to the ring delay line has arrived, is a specified value other than the data items corresponding to the remaining other delay units DU. This therefore makes it possible to digitize a position at which the circulated pulse signal inputted to the ring delay line has arrived in the ring delay line to thereby generate the z-bit data O4.

That is, each of the encoders 31 to 34 is configured to read and encode the data latched by the corresponding one of the latches 21 to 24 using each pulse of the sampling clock reference signal CKs on which the clocks CK1 to CKm are generated.

This therefore enables each of the encoders 31 to 34 to digitize a position at which the circulated pulse signal inputted to the ring delay line has arrived in the ring delay line to thereby generate the corresponding one of the z-bit data O1, z-bit data O2, z-bit data O3, and z-bit data O4.

The latch-subtractor module 35 connected to the encoder 31 as the subsequent stage includes a latch 41 and a subtractor 51, and the latch-subtractor module 36 connected to the encoder 32 as the subsequent stage includes a latch 42 and a subtractor 52. Similarly, the latch-subtractor module 37 connected to the encoder 33 as the subsequent stage includes a latch 43 and a subtractor 53, and the latch-subtractor module 38 connected to the encoder 34 as the subsequent stage includes a latch 44 and a subtractor 54.

Each of the latches 41 to 44 is configured to latch corresponding one of the code data O1, code data O2, code data O3, and code data O4 outputted from the encoders 31, 32, 33, and 34 at the sample time corresponding to the occurrence of each pulse of the sampling clock reference signal CKs. That is, each of the latches 41 to 44 is configured to store, as previous code data, corresponding one of the code data O1, code data O2, code data O3, and code data O4 outputted from the encoders 31, 32, 33, and 34 at the sample time corresponding to the occurrence of each pulse of the sampling clock reference signal CKs.

Each of the subtractors 51 to 54 is configured to subtract, as present code data, a corresponding one of the code data O1, code data O2, code data O3, and code data O4 outputted from the encoders 31, 32, 33, and 34 at the sample time corresponding to the occurrence of each pulse of the sampling clock reference signal CKs from the previous code data stored in the corresponding one of the latches 41 to 44 to thereby calculate deviation data between the present code data and the previous code data. Then, each of the subtractors 51 to 54 is configured to output, to the adder 5, the deviation data as corresponding one of n-bit digital numeric data items DT1 to DT4.

The adder 5 is configured to add the n-bit digital numeric data items DT1 to DT4 to each other to thereby generate a digital numeric data item DTA having (n+log$_2$ m) bits; m is set to 4 according to the first embodiment.

Various processing units can be provided in place of the adder 5. Each of the various processing units can be configured to output any digital numeric data based on the n-bit digital numeric data items DT1 to DT4.

The above encoders 31 to 34, the latches 41 to 44, and the subtractors 51 to 54 constitute the encoder unit 60 according to the first embodiment.

That is, the encoder unit 60 is configured to (I) Calculate deviation data between the present code data and the previous code data of the output data items DO1 latched by the latch modules 21 and outputted from the secondary latches 21s to thereby convert the output data items DO1 into the n-bit digital numeric data item DT1

(II) Calculate deviation data between the present code data and the previous code data of the data items DO2 latched by the latch modules 22 and outputted from the secondary latches 22s to thereby convert the data items DO2 into the n-bit digital numeric data item DT2

(III) Calculate deviation data between the present code data and the previous code data of the data items DO3 latched by the latch modules 23 and outputted from the secondary latches 23s to thereby convert the data items DO3 into the n-bit digital numeric data item DT3

(IV) Calculate deviation data between the present code data and the previous code data of the data items DO4 latched by the latch modules 24 and outputted from the secondary latches 24s to thereby convert the data items DO4 into the n-bit digital numeric data item DT4

The A/D converter 1 described above is configured such that the delay time Td of each delay unit DU changes depending on the level of the analog input voltage signal Vin. Specifically, the higher the level of the analog input voltage signal Vin, the lower the on resistance of each transistor constituting each delay unit DU, resulting in the delay time Td of each delay unit DU being shorter.

In contrast, the lower the level of the analog input voltage signal Vin, the higher the on resistance of each transistor constituting each delay unit DU, resulting in the delay time Td of each delay unit DU being longer.

This causes each of the digital numeric data items DT1 to DT4 digitized by the pulse position digitizing circuit 4 to change, making it possible to therefore obtain the digital numeric data item DTA based on the digital numeric data items DT1 to DT4 depending on the level of the analog input voltage signal Vin.

Structural and Functional Significance of Each Latch Module

The following describes the structural and functional significance of the latch modules 21 to 24 according to the first embodiment.

Figure 4:
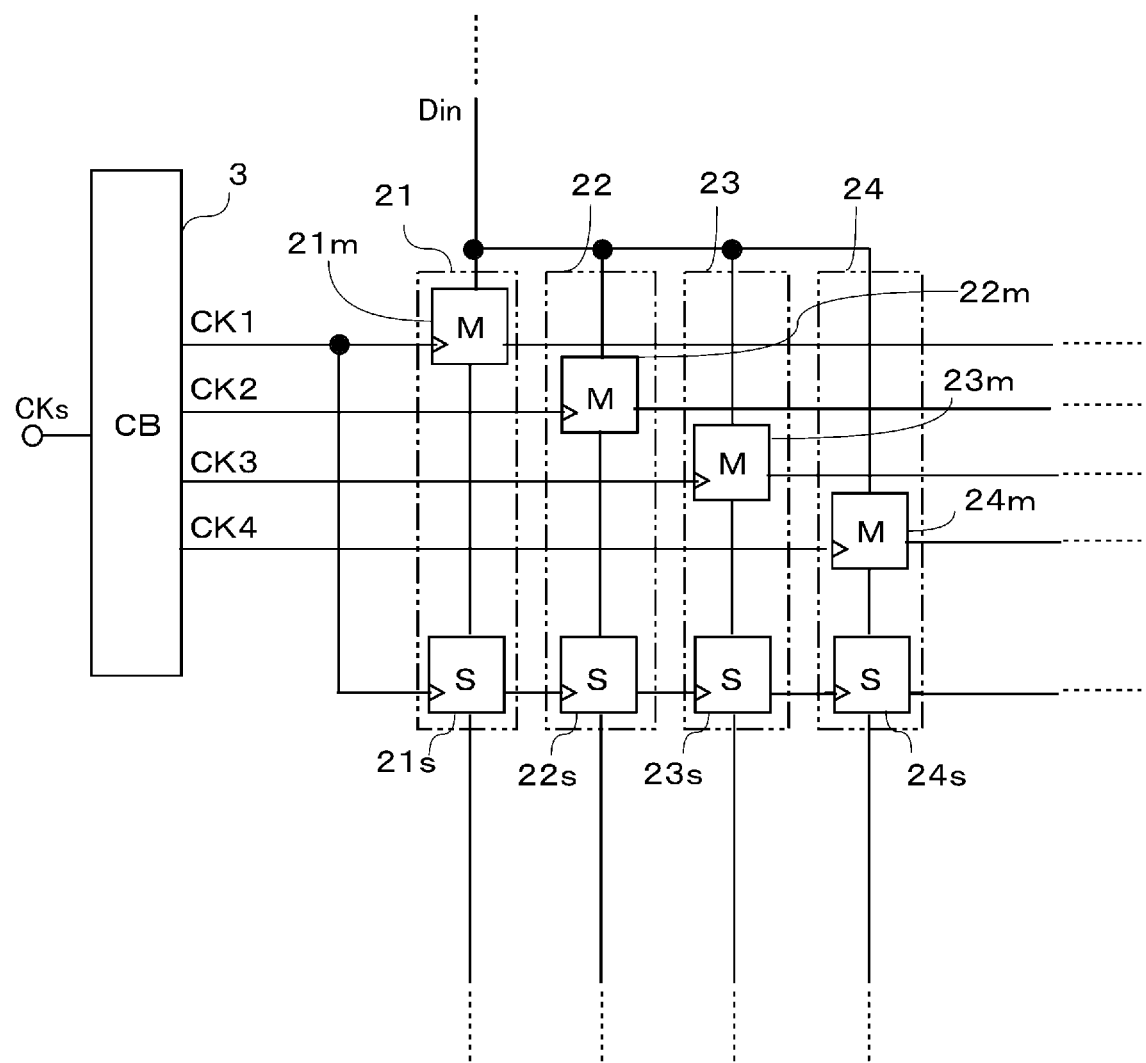
FIG. 4 is an enlarged view schematically illustrating (i) an electrical configuration of each of latch modules provided for a first delay unit illustrated in FIG. 1 and (ii) electrical connections of the latch modules.
Figure 5:
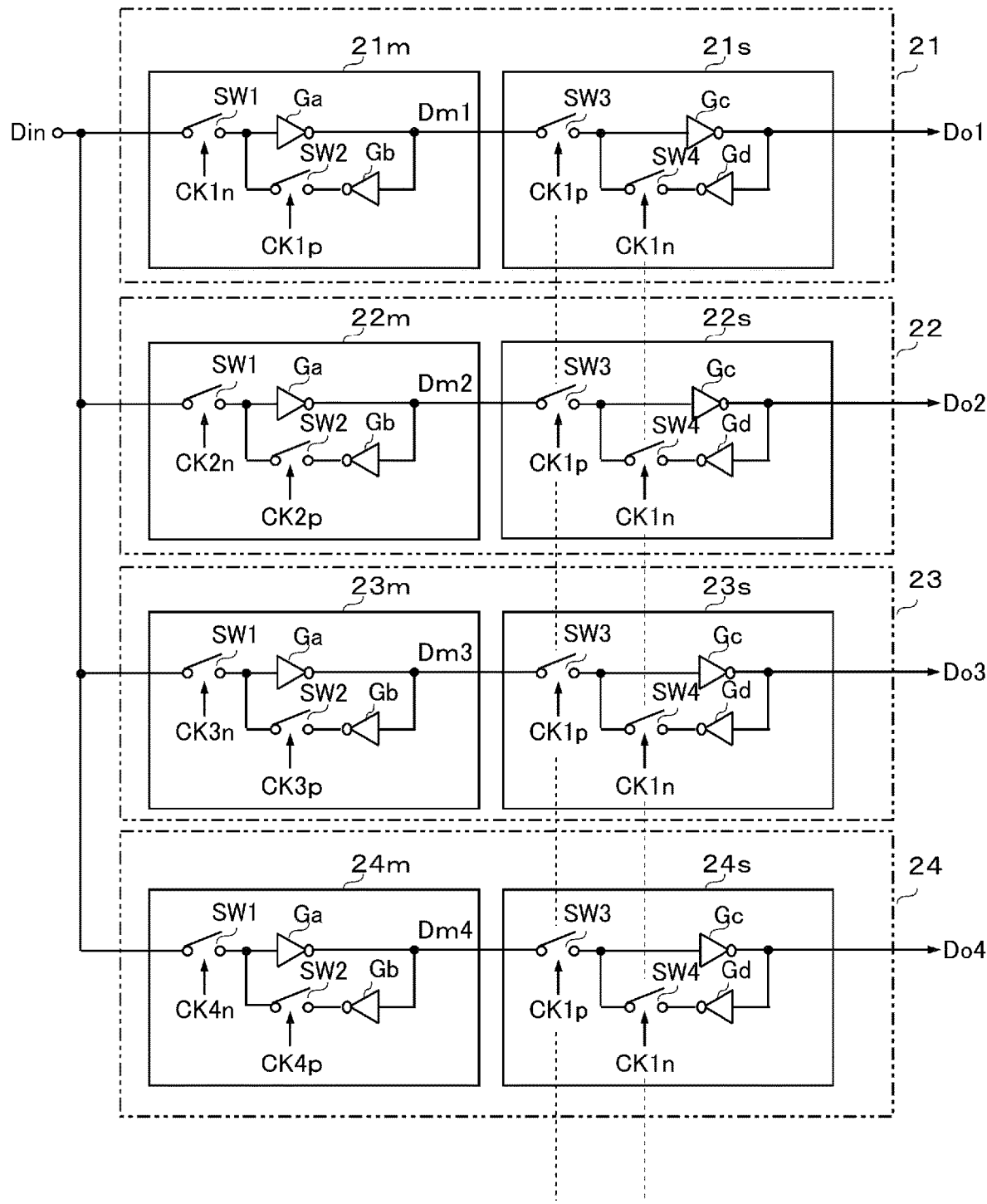
FIG. 5 is an electrical circuit diagram illustrating a schematic configuration of each of the latch modules illustrated in FIG. 4.

FIG. 4 is an enlarged view of the latch modules 21 to 24 provided for, for example, the first delay unit DU (G1), and FIG. 5 is an example of a circuit configuration of each of the latch modules 21 to 24 illustrated in FIG. 4. Hereinafter, an output level, i.e., a high level or a low level, of the NOT gate 20 will be referred to as Din.

As illustrated in FIGS. 4 and 5, each of the latch modules 21 to 24 is designed as a primary-secondary latch module. Specifically, the latch module 21 is comprised of the first stage of primary latch 21m and the second stage of secondary latch 21s connected in series thereto, and the latch module 22 is comprised of the first stage of primary latch 22m and the second stage of secondary latch 22s connected in series thereto. Similarly, the latch module 23 is comprised of the first stage of primary latch 23m and the second stage of secondary latch 23s connected in series thereto, and the latch module 24 is comprised of the first stage of primary latch 24m and the second stage of secondary latch 24s connected in series thereto.

The output level Din of the NOT gate 20 is inputted to each of the primary latches 21m to 24m.

Each of the first-stage primary latches 21m to 24m is designed as a CMOS static circuit that includes a feedback loop comprised of a NOT gate Gb, and latches a corresponding one of outputs Dm1 to Dm4.

The circuit configurations of the respective first-stage primary latches 21m to 24m are identical to one another, so that reference characters assigned to the respective components of the first-stage primary latch 21m are used to be assigned to the corresponding respective components of each of the other first-stage primary latches 22m to 24m.

Each of the second-stage primary latches 21s to 24s is designed as a CMOS static circuit that includes a feedback loop comprised of a NOT gate Gd, and latches corresponding one of the output data items Do1 to the output data items Do4.

The circuit configurations of the respective second-stage secondary latches 21s to 24s are identical to one another, so that reference characters assigned to the respective components of the second-stage secondary latch 21s are used to be assigned to the corresponding respective components of each of the other second-stage secondary latches 22s to 24s.

The following describes electrical connections among the components of the primary latch 21m, which is selected as a typical example of the primary latches 21m to 24m, and electrical connections among the components of the secondary latch 21s, which is selected as a typical example of the secondary latches 21s to 24s. Descriptions of electrical connections among the components of each of the other primary latches 22m to 24m are omitted, and descriptions of electrical connections among the components of each of the other secondary latches 22s to 24s are similarly omitted.

The primary latch 21m includes switches SW1 and SW2, a NOT gate Ga, and the NOT gate Gb. Similarly, the secondary latch 21s includes switches SW3 and SW4, a NOT gate Gc, and the NOT gate Gd.

Each of the switches SW1 to SW4 has opposing first and second ends, and each of the NOT gates Ga, Gb, Gc, and Gd has input and output terminals.

The output level Din of the NOT gate 20 is inputted to the first end of the switch SW1, and the second end of the switch SW1 is connected to the input terminal of the NOT gate Ga. The output terminal of the NOT gate Ga is connected to both the input terminal of the NOT gate Gb and the first end of the switch SW3 of the secondary latch 21s.

The output terminal of the NOT gate Gb is connected to the first end of the switch SW2. The second end of the switch SW2 is connected to the input terminal of the NOT gate Ga.

Each of the switches SW1 to SW4 has a control terminal. To the control terminal of the switch SW1, the clock CK1 is inputted. The negative edge, which will be referred to as CK1n, of the clock CK1 turns on the switch SW1, and the positive edge, which will be referred to as CK1p, of the clock CK1 turns off the switch SW1. To the control terminal of the switch SW2, the clock CK1 is inputted. The positive edge CK1p of the clock CK1 turns on the switch SW2, and the negative edge CK1n of the clock CK1 turns off the switch SW2.

This causes the switch SW1 and the switch SW2 to be complementarily turned on or off.

The on state of the switch SW1 causes the inverted level of the output level Din of the NOT gate 20 to be outputted as an output level D1m of the primary latch 21m to the second-stage secondary latch 21s. In contrast, the on state of the switch SW2 causes the switch SW1 to be turned off. This therefore enables the primary latch 21m to hold the level D1m independently of change of the output level Din of the NOT gate 20 while the switch SW1 is in the off state.

As to the secondary latch 21s, the output level Dm1 of the primary latch 21m is inputted to the first end of the switch SW3, and the second end of the switch SW3 is connected to the input terminal of the NOT gate Gc.

The output terminal of the NOT gate Gc is connected to both the input terminal of the NOT gate Gd and the encoder 31, so that an output of the output terminal of the NOT gate Gc is inputted to the encoder 31 as the output data item Do1.

The output terminal of the NOT gate Gd is connected to the first end of the switch SW4. The second end of the switch SW4 is connected to the input terminal of the NOT gate Gc.

To the control terminal of the switch SW3, the clock CK1 is inputted. The positive edge CK1p of the clock CK1 turns on the switch SW3, and the negative edge CK1n of the clock CK1 turns off the switch SW3. To the control terminal of the switch SW4, the clock CK1 is inputted. The negative edge CK1n of the clock CK1 turns on the switch SW4, and the positive edge CK1p of the clock CK1 turns off the switch SW2.

This causes the switch SW3 and the switch SW4 to be complementarily turned on or off.

The on state of the switch SW3 causes the inverted level of the output level Dm1 of the primary latch 21m to be outputted as the output data item Do1 to the encoder 31. In contrast, the on state of the switch SW4 causes the switch SW3 to be turned off. This therefore enables the secondary latch 21s to hold the level of the output data item Do1 independently of change of the output level Dm1 of the primary latch 21m while the switch SW3 is in the off state.

The operations of each of the other primary latches 22m to 24m are identical to those of the primary latch 21m except that the clocks CK2 to CK4 are inputted to the respective other primary latches 22m to 24m in place of the sampling lock CK1, so that descriptions of the operations of each of the other primary latches 22m to 24m are omitted. Similarly, the operations of each of the other secondary latches 22s to 24s are identical to those of the secondary latch 21s, so that descriptions of the operations of each of the other secondary latches 22s to 24s are omitted.

FIG. 5 clearly shows that the clock CK1 is commonly inputted to the switches SW3 and SW4 of each of the secondary latches 21s to 24s, so that all the switches SW3 of the secondary latches 21s to 24s are turned on or off in synchronization with one another, and all the switches SW4 of the secondary latches 21s to 24s are turned on or off in synchronization with one another.

In contrast, FIG. 5 clearly shows that the clocks CK1 to CK4, which are different from each other, are inputted to the switches SW1 and SW2 of the respective primary latches 21m to 24m.

Specifically, to the control terminal of the switch SW1 of the primary latch 22m, the clock CK2 is inputted. The negative edge, which will be referred to as CK2n, of the clock CK2 turns on the switch SW1 of the primary latch 22m, and the positive edge, which will be referred to as CK2p, of the clock CK2 turns off the switch SW1 of the primary latch 22m. To the control terminal of the switch SW2 of the primary latch 22m, the clock CK2 is inputted. The positive edge CK2p of the clock CK2 turns on the switch SW2 of the primary latch 22m, and the negative edge CK2n of the clock CK2 turns off the switch SW2 of the primary latch 22m.

To the control terminal of the switch SW1 of the primary latch 23m, the clock CK3 is inputted. The negative edge, which will be referred to as CK3n, of the clock CK3 turns on the switch SW1 of the primary latch 23m, and the positive edge, which will be referred to as CK3p, of the clock CK3 turns off the switch SW1 of the primary latch 23m. To the control terminal of the switch SW2 of the primary latch 23m, the clock CK3 is inputted. The positive edge CK3p of the clock CK3 turns on the switch SW2 of the primary latch 23m, and the negative edge CK3n of the clock CK3 turns off the switch SW2 of the primary latch 23m.

To the control terminal of the switch SW1 of the primary latch 24m, the clock CK4 is inputted. The negative edge, which will be referred to as CK4n, of the clock CK4 turns on the switch SW1 of the primary latch 24m, and the positive edge, which will be referred to as CK4p, of the clock CK4 turns off the switch SW1 of the primary latch 24m. To the control terminal of the switch SW2 of the primary latch 24m, the clock CK4 is inputted. The positive edge CK4p of the clock CK4 turns on the switch SW2 of the primary latch 24m, and the negative edge CK4n of the clock CK4 turns off the switch SW2 of the primary latch 24m.

Each of the primary latches 21m to 24m is configured to read the output level Din of the NOT gate 20 at the sample time corresponding to the occurrence of the negative edge CK1n, CK2n, CK3n, CK4n of the corresponding one of the clocks CK1 to CK4.

Figure 6:
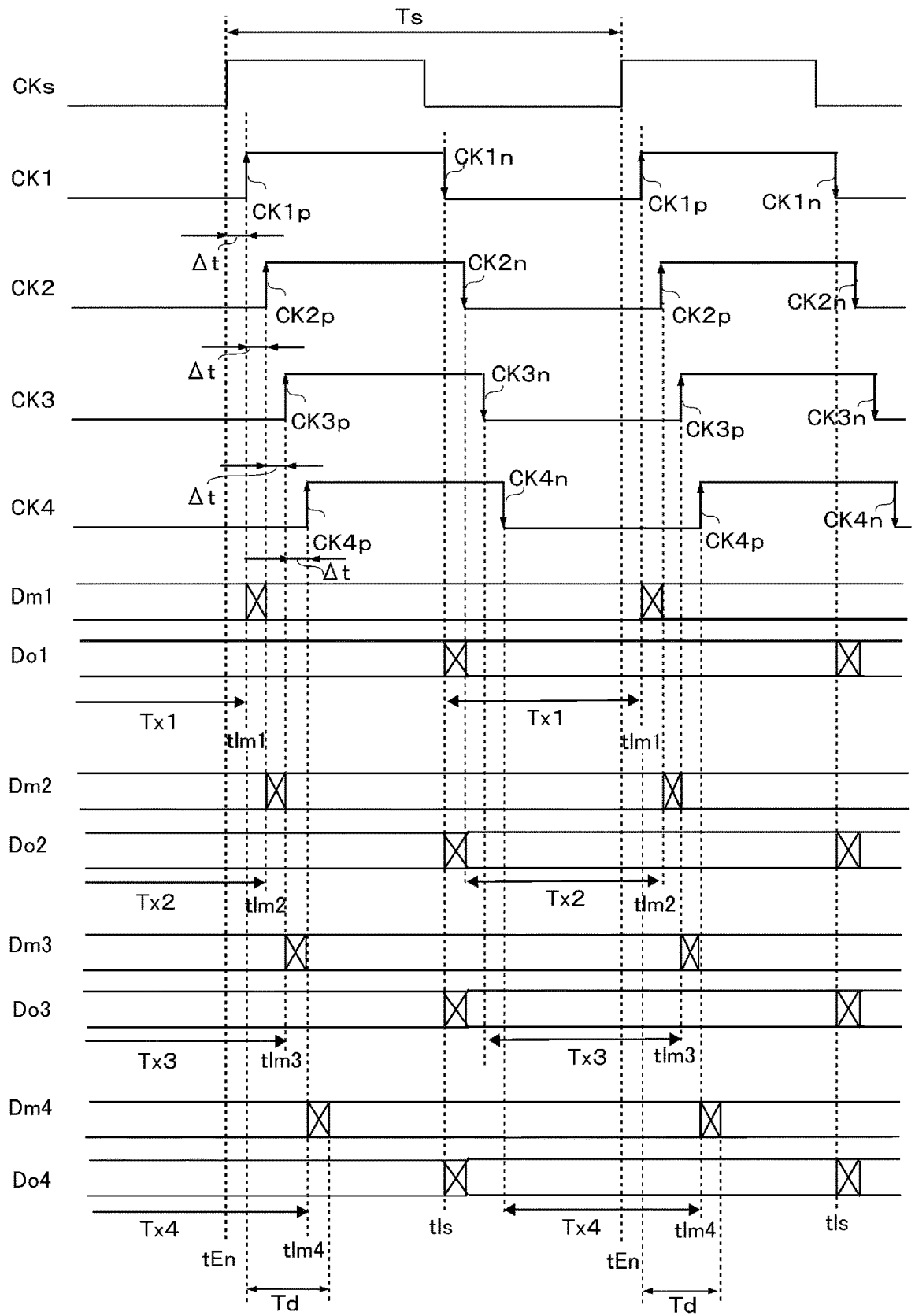
FIG. 6 is a timing chart schematically illustrating how each of the latch modules works according to the first embodiment.

Additionally, as illustrated in FIG. 6, the primary latch 21m is configured to hold, i.e., latch, the output level Din of the NOT gate 20 at the sample time corresponding to the occurrence (see reference character tlm1) of the positive edge CK1p of the clock CK1, and the primary latch 22m is configured to hold, i.e., latch, the output level Din of the NOT gate 20 at the sample time corresponding to the occurrence (see reference character tlm2) of the positive edge CK2p of the clock CK2.

Similarly, the primary latch 23m is configured to hold, i.e., latch, the output level Din of the NOT gate 20 at the sample time corresponding to the occurrence (see reference character tlm3) of the positive edge CK3p of the clock CK3, and the primary latch 24m is configured to hold, i.e., latch, the output level Din of the NOT gate 20 at the sample time corresponding to the occurrence (see reference character tlm4) of the positive edge CK4p of the clock CK4.

Thereafter, the secondary latches 21s to 24s are configured to hold, i.e., latch, the output data items Do1 to the output data items Do4 simultaneously at the timing (see reference character t1s) of the occurrence of the negative edge CK1n of the clock CK1.

That is, the primary latches 21m to 24m latch the output level of Din of the NOT gate 20 at the sample times of the different occurrences tlm1 to tm4 of the positive edges CK1p to CK4p of the different clocks CK1 to CK4. This enables, even if the clock CK1 is commonly inputted to the second-state secondary latches 21s to 24s, the output level of Din of the NOT gate 20 to be latched at the different sample times 1×Δt, 2×Δt, 3×Δt, and 4×Δt relative to the positive edge of each pulse of the sampling clock reference signal CKs. This enables the latch modules 21 to 24 to operate stably.

As described above, each of the encoders 31 to 34 is configured to read and encode the corresponding data items latched by the respective latch modules 21, 22, 23, or 24 into z-bit data in synchronization with the occurrence of each pulse of the sampling clock reference signal CKs based on which the clocks CK1 to CKm are generated.

That is, let us consider a case where the encoder 31 is about to read the output data items Do1 latched by the latch module 21 at the sample time corresponding to the occurrence of any pulse (current pulse) of the sampling clock reference signal CKs.

In this case, the output data items Do1 are reliably latched by the latch module 21 at the sample time corresponding to the occurrence timing t1s of the negative edge CK1n of the pulse of the clock CK1 that is generated based on the immediately previous pulse of the sampling clock reference signal CKs. This therefore enables the encoder 31 to stably read the output data items Do1 latched by the latch module 21 at the sample time corresponding to the occurrence (see reference character tEn in FIG. 6) of the current pulse of the sampling clock reference signal CKs, making it possible for the encoder 31 to encode the output data items Do1 stably.

Like the encoder 31, the encoder 32 stably reads the data items Do2 latched by the latch module 22 at the sample time corresponding to the occurrence (see reference character tEn in FIG. 6) of the current pulse of the sampling clock reference signal CKs, making it possible for the encoder 32 to encode the data items Do2 stably.

Similarly, the encoder 33 stably reads the data items Do3 latched by the latch module 23 at the sample time corresponding to the occurrence (see reference character tEn in FIG. 6) of the current pulse of the sampling clock reference signal CKs, making it possible for the encoder 33 to encode the data items Do3 stably. Additionally, the encoder 34 stably reads the data items Do4 latched by the latch module 24 at the sample time corresponding to the occurrence (see reference character tEn in FIG. 6) of the current pulse of the sampling clock reference signal CKs, making it possible for the encoder 34 to encode the data items Do4 stably.

The output data items Do1 to Do4 outputted from the encoders 31 to 34 to the next stage can be subjected to any processing using the sampling clock reference signal CKs.

A/D Converter According to Comparison Example

Figure 7:
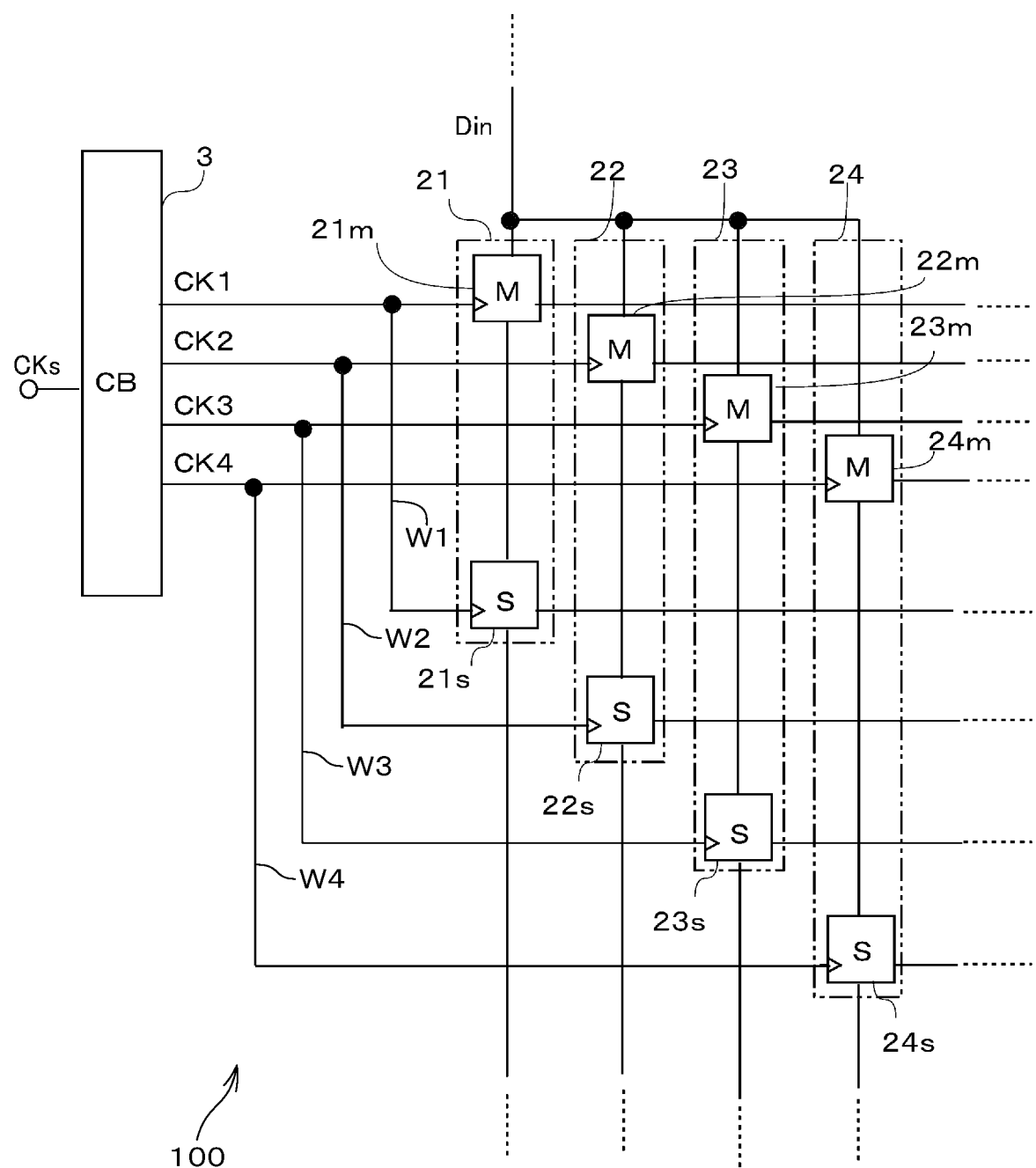
FIG. 7 is an enlarged view schematically illustrating (i) an electrical configuration of each of latch modules provided for a first delay unit according to a comparative example and (ii) electrical connections of the latch modules according to the comparative example.

FIG. 7 is an enlarged view of the latch modules 21 to 24 provided for, for example, the first delay unit DU (G1) in an A/D converter 100 according to a comparison example, which corresponds to FIG. 4.

As illustrated in FIG. 7, the secondary latches 21s to 24s for each of the n delay units DU are configured to latch the output of the corresponding one of the delay units DU through the NOT gate 20 at the sample times corresponding to the respective occurrences of the different clocks CK1 to CK4 that are used as the operation clocks by the respective primary latches 21m to 24m.

The above configuration of the A/D converter 100 according to the comparison example requires four main wirings W1 to W4 provided to connect between the CMOS inverters M2a1 to M2a4 for outputting the sampling clocks CK1 to CK4 and the secondary latches 21s to 24s, respectively. This results in an increase in the number of wirings that connect the clock generator 3 to the respective secondary latches 21s to 24s and an increase in the length of each of the wirings, resulting in a larger footprint of the wirings in a component layout space in the A/D converter 100 according to the comparison example.

In particular, if the A/D converter 100 according to the comparison example use three-dimensional transistors, such as Fin Field-Effect Transistors (FinFETs) or Gate All Around (GAA) FETs, which can be implemented by ever finer CMOS fabrication processes, the proportion of the wirings for connecting between the clock generator 3 and the respective secondary latches 21s to 24s in the total component layout space in the A/D converter 100 according to the comparison example. This therefore results in a relative increase in a footprint of the latch modules 21 to 24 in the component layout space allocated for the pulse delay circuit 2 in the A/D converter 100 according to the comparison example. This may result in both a reduction in the performance of the A/D converter according to the comparison example and an increase of manufacturing cost of the A/D converter 100 according to the comparison example.

A/D Converter According to First Embodiment

In contrast, the A/D converter 1 is configured such that the clock CK1 is commonly inputted to the secondary latches 21s to 24s of the respective latch modules 21 to 24 provided for each delay unit DU. This configuration therefore enables all the secondary latches 21s to 24s to share the single clock CK1, making it possible to connect the CMOS inverter M2a1 for outputting the sampling clock CK1 to the secondary latches 21s to 24s using a single main wiring W1 (see FIG. 3).

This therefore results in a reduction in the number of wirings that connect the clock generator 3 to the respective secondary latches 21s to 24s, resulting in a smaller footprint of the single wiring in a component layout space in the A/D converter 1 according to the first embodiment. This consequently results in a reduction in size of the A/D converter 1 and in efficient improvement of the pulse-delay characteristics of the A/D converter 1, making it possible to improve the manufacturing yield of products of the A/D converter 1 with lower cost.

The above configuration of the A/D converter 1 minimizes adverse effects due to parasitic impedance, such as parasitic capacitance and/or parasitic resistance, in wirings for transfer of the clocks CK1 to CK4, making it possible to maintain the performance reliability of the A/D converter 1.

The above configuration of the A/D converter 1 additionally reduces adverse effects due to parasitic impedance, such as parasitic capacitance and/or parasitic resistance, in wirings for reading the pulses P1 to Pn outputted from the respective delay units G1 to Gn, making it possible for each latch 21 to stably read the state of each of the pulses P1 to Pn outputted from the respective delay units G1 to Gn.

In addition, the pulse delay unit 2 of the A/D converter 1 according to the first embodiment is configured such that the delay units DU are cascade-connected to one another to constitute a ring delay line. This results in a more reduction in size of the A/D converter 1 and in more efficient improvement of the pulse-delay characteristics of the A/D converter 1.

Figure 8:
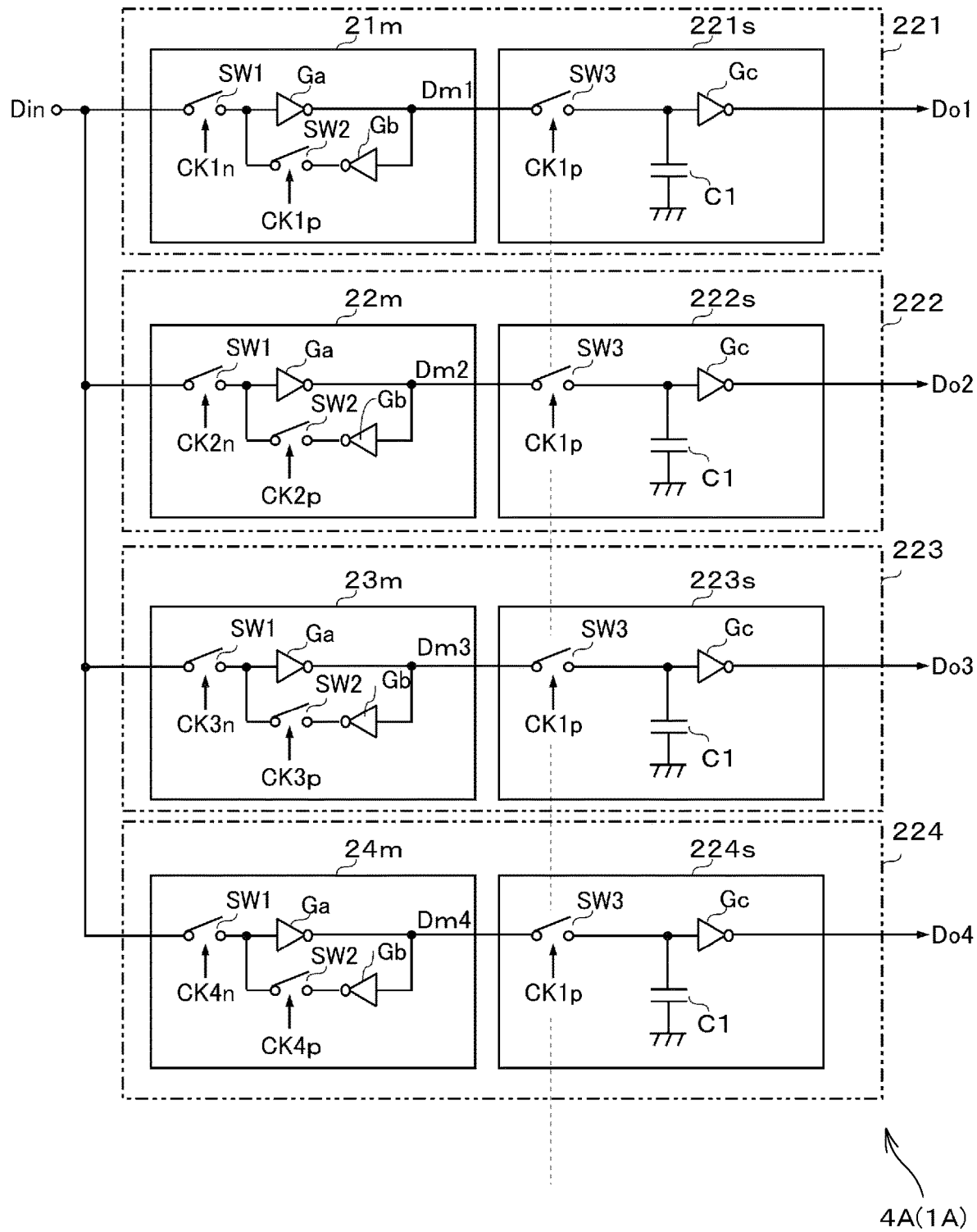
FIG. 8 is an electrical circuit diagram illustrating a schematic configuration of each of latch modules according to a second embodiment of the present disclosure.

Each of the encoders 31 to 34 according to the first embodiment is configured to read and encode the data latched by the corresponding one of the latches 21 to 24 using each pulse of the sampling clock reference signal CKs on which the clocks CK1 to CKm are generated. This configuration therefore enables (1) The encoder 31 to read and encode the data items Do1 outputted from the secondary latches 21s stably
(2) The encoder 32 to read and encode the data items Do2 outputted from the secondary latches 22s stably
(3) The encoder 33 to read and encode the data items Do3 outputted from the secondary latches 23s stably
(2) The encoder 34 to read and encode the data items Do4 outputted from the secondary latches 24s stably Second Embodiment The following describes an A/D converter 1A according to the second embodiment with reference to FIG. 8. The structure and/or functions of the A/D converter 1A according to the second embodiment are mainly identical to those of the A/D converter 1 except for the following points. The following therefore describes mainly the different points.

The A/D converter 1A according to the second embodiment includes a pulse position digitizing circuit 4A, and the pulse position digitizing circuit 4A is comprised of latch modules 221 to 224 in place of the latch modules 21 to 24.

Each of the latch modules 221 that are provided for the respective delay units DU is comprised of the primary latch 21m and a secondary latch 221s connected in series to one another, and each of the latch modules 222 that are provided for the respective delay units DU is comprised of the primary latch 22m and a secondary latch 222s connected in series to one another. Similarly, each of the latch modules 223 that are provided for the respective delay units DU is comprised of the primary latch 23m and a secondary latch 223s connected in series to one another, and each of the latch modules 224 that are provided for the respective delay units DU is comprised of the primary latch 24m and a secondary latch 224s connected in series to one another.

Each of the second-stage primary latches 221s to 224s is designed as a CMOS dynamic circuit that latches corresponding one of the output data items Do1 to the output data items Do4 without using a feedback loop.

The circuit configurations of the respective second-stage secondary latches 221s to 224s are identical to one another, so that reference characters assigned to the respective components of the second-stage secondary latch 221s are used to be assigned to the corresponding respective components of each of the other second-stage secondary latches 222s to 224s.

The following describes electrical connections among the components of the secondary latch 221s, which is selected as a typical example of the secondary latches 221s to 224s. Descriptions of electrical connections among the components of each of the other secondary latches 222s to 224s are similarly omitted.

The secondary latch 221s includes the switches SW3 and SW4, the NOT gate Gc, and a capacitor C1 that has opposing first and second electrodes.

The output level Dm1 of the primary latch 21m is inputted to the first end of the switch SW3, and the second end of the switch SW3 is connected to the input terminal of the NOT gate Gc. The output terminal of the NOT gate Gc is connected to the encoder 31, so that the output of the output terminal of the NOT gate Gc is inputted to the encoder 31 as the output data item Do1.

For example, the NOT gate Gc is comprised of a CMOS inverter with a parasitic capacitance at its input as a gate input capacitance, and an additional parasitic capacitance is parasitic on a wiring connecting between the second end of the switch SW3 and the input terminal of the NOT gate Gc.

These parasitic capacitances are illustrated as the capacitor C1 between a common signal ground of the secondary latch 221s and the wiring connecting between the second end of the switch SW3 and the input terminal of the NOT gate Gc. For this reason, there is no need to ensure a predetermined space in the component layout space allocated for the secondary latch 221s.

To the control terminal of the switch SW3, the clock CK1 is inputted. The positive edge CK1p of the clock CK1 turns on the switch SW3, and the negative edge CK1n of the clock CK1 turns off the switch SW3.

The on state of the switch SW3 causes the inverted level of the output level Dm1 of the primary latch 21m to be outputted as the output data item Do1 to the encoder 31 and to be charged in the capacitor C1.

In contrast, the off state of the switch SW3 causes the switch SW3 to be turned off. At that time, the secondary latch 221s holds the level of the output data item Do1 based on the charged capacitor C1 independently of change of the output level Dm1 of the primary latch 21m while the switch SW3 is in the off state.

This configuration of the pulse position digitizing circuit 4A reduces the number of components that constitute each of the secondary latches 221s to 224s as compared with the number of components that constitute each of the secondary latches 21s to 24s. That is, this configuration of the pulse position digitizing circuit 4A results in a smaller footprint of each of the secondary latches $221s$ to $224s$ by the NOT gate Gd and switch SW4 as compared with a footprint of the corresponding one of the secondary latches $21s$ to $24s$ of the pulse position digitizing circuit 4 according to the first embodiment. This therefore makes it possible to improve the manufacturing yield of products of the A/D converter 1A with lower cost.

The above configuration of the A/D converter 1A minimizes adverse effects due to parasitic impedance, such as parasitic capacitance and/or parasitic resistance, in wirings for transfer of the clocks CK1 to CK4, making it possible to maintain the performance reliability of the A/D converter 1A.

If there is a certain amount of margin is ensured in the component layout space in the A/D converter 1A, devising the layout of the pulse position digitizing circuit 4A can obtain an added capacitance as the capacitor C1, enabling the level of the output data item Do1 to be more stable.

Third Embodiment

Figure 9:
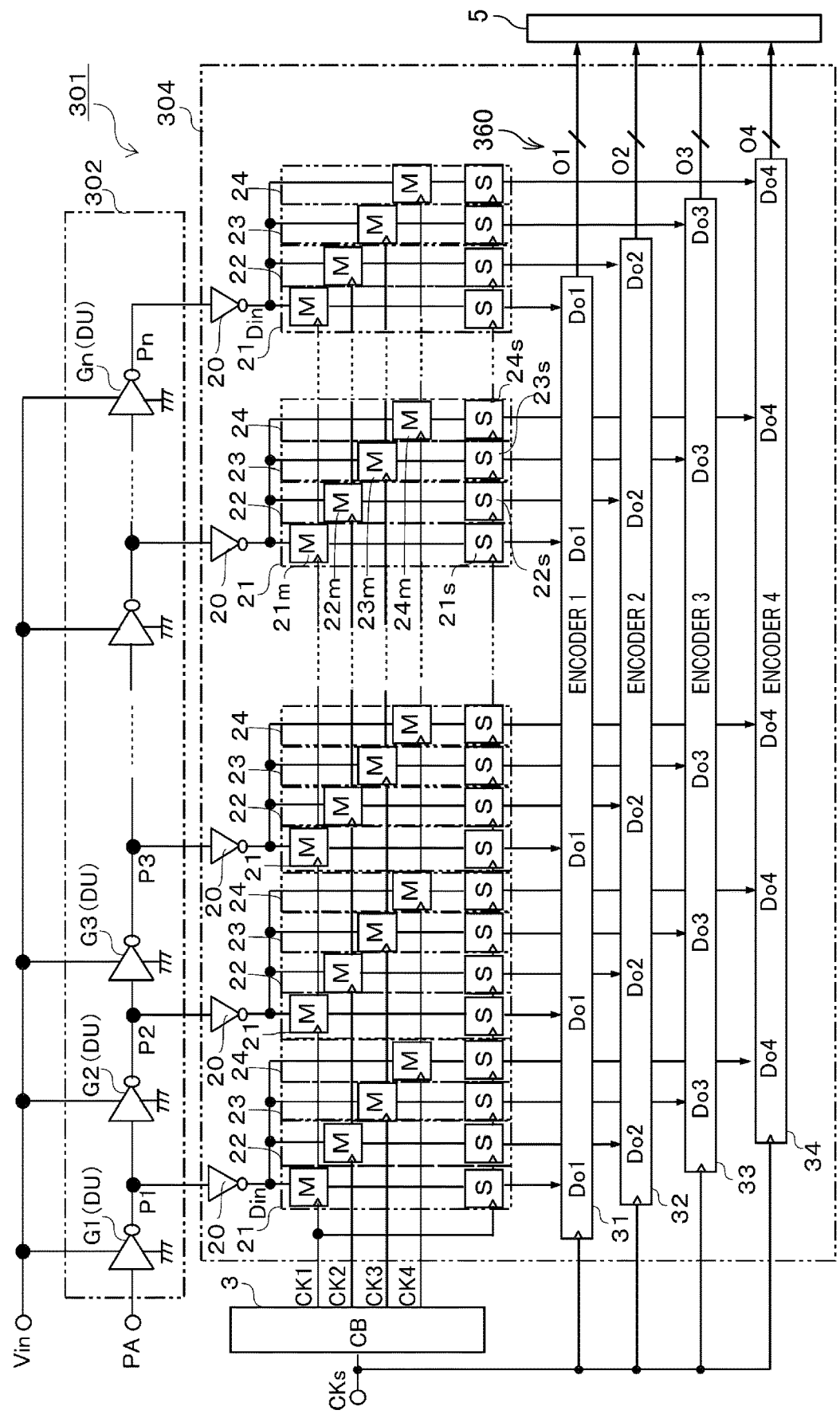
FIG. 9 is a block diagram illustrating a schematic configuration of an A/D converter according to a third embodiment of the present disclosure.
Figure 10:
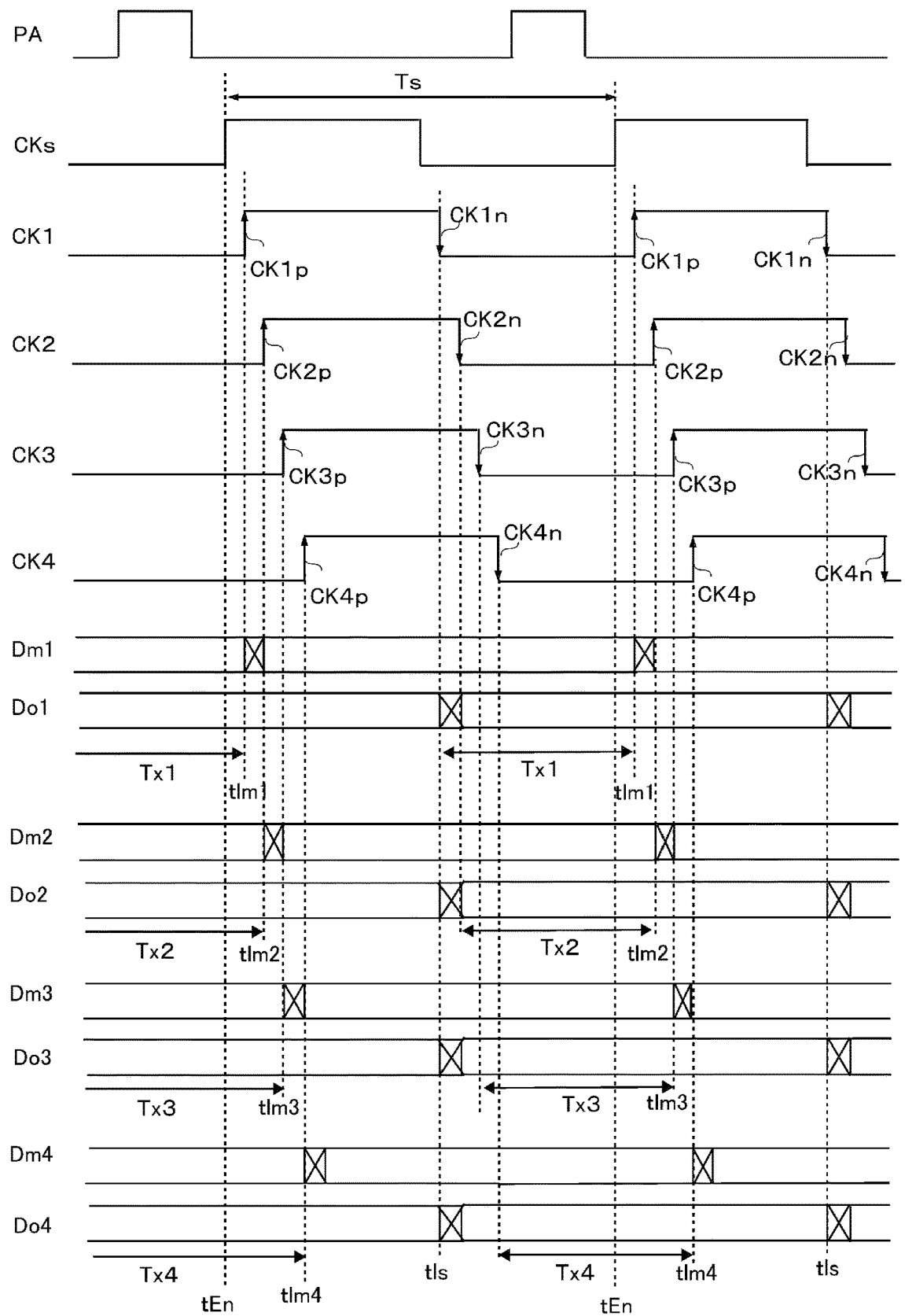
FIG. 10 is a timing chart schematically illustrating how each of the latch modules works according to the third embodiment.
Figure 11:
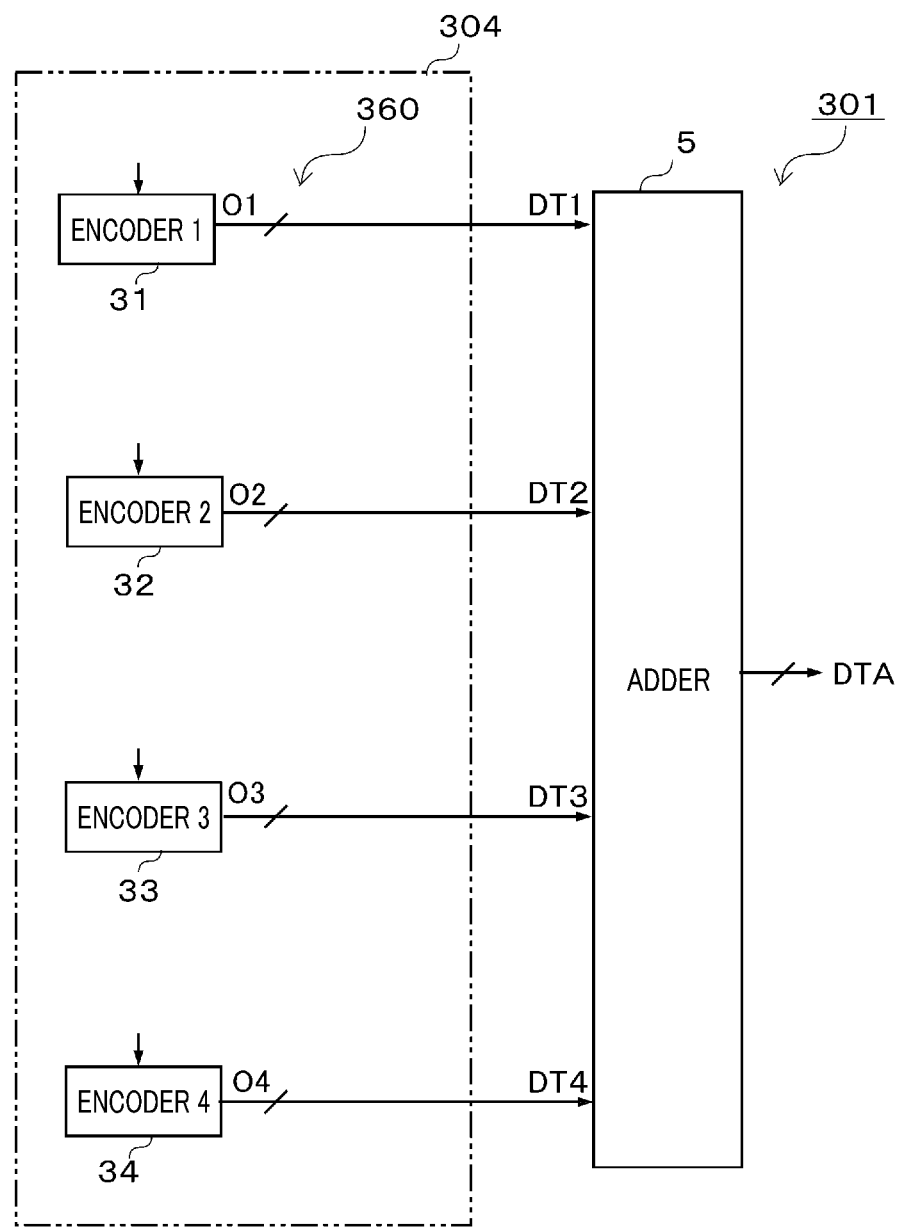
FIG. 11 is an electrical and block diagram illustrating a schematic configuration of an encoder unit of the A/D converter illustrated in FIG. 9.

The following describes an A/D converter 301 according to the third embodiment with reference to FIGS. 9 to 11. The structure and/or functions of the A/D converter 301 according to the third embodiment are mainly identical to those of the A/D converter 1 except for the following points. The following therefore describes mainly the different points.

The pulse delay circuit 2 according to the first embodiment is configured such that the delay units DU, which include the NAND gate G1 and the NOT gates G2 to G15, are cascade-connected to one another in a ring form, but the present disclosure is not limited to this configuration.

Specifically, the delay units DU cannot be connected to one another in a ring form as long as they are connected in series to one another.

From this viewpoint, the A/D converter 301 according to the third embodiment includes a pulse delay line 302 comprised of n delay units DU connected in series to one another in a non-loop form. That is, the n delay units DU are designed to constitute an open delay line.

Specifically, the first to nth delay units DU are respectively comprised of NOT gates G1 to Gn.

Each of the first to nth delay units G1 to Gn has an input terminal and an output terminal.

The input terminal of each delay unit G2, ..., Gn except for the first delay unit G1 is cascade-connected to the output terminal of the immediately previous stage delay unit G1, ..., Gn−1. A pulse signal PA is input to the first input terminal of the first delay unit G1.

The output terminals of the respective delay units G1 to Gn are also connected to the pulse position digitizing circuit 4, so that the pulse signal outputted from each of the delay units G1 to Gn is inputted to the pulse position digitizing circuit 4.

Like the first embodiment, the output terminal of the first delay unit DU (G1) is connected to the latch modules 21 to 24 provided for the first delay unit DU (G1) via the NOT gate 20, the output terminal of the second delay unit DU (G2) is connected to the latch modules 21 to 24 provided for the second delay unit DU (G2) via the NOT gate 20, ..., and the output terminal of the nth delay unit DU (Gn) is connected to the latch modules 21 to 24 provided for the nth delay unit DU (Gn) via the NOT gate 20.

When the pulse signal PA is input to the input terminal of the first delay unit G1, the first delay unit G1 works to transfer the pulse signal PA to the next delay unit G2 while delaying the pulse signal by the predetermined time of delay Td.

Each of the remaining delay units G2 to Gn−1 except for the last delay unit Gn sequentially transfers the pulse signal PA transferred from the immediately previous delay unit to the next delay unit while delaying the pulse signal by the predetermined time of delay Td.

The analog input voltage signal Vin is inputted to each of the delay units G1 to Gn as the power supply voltage, so that the power supply voltage inputted to each of the delay units G1 to Gn activates the corresponding one of the delay units G1 to Gn.

The pulse delay unit 302 described above is configured such that each pulse of the pulse signal PA is inputted to the first delay unit DU (G1) every cycle Ts of the sampling clock reference signal CKs (see FIG. 10), so that transfer of each pulse of the pulse signal PA through the delay units DU (G1 to Gn) is started.

Specifically, each of the encoders 31 to 34 of a pulse position digitizing circuit 304 according to the third embodiment is configured to (1) Obtain a phase difference between the positive edge or negative edge of each pulse of the pulse signal PA and the corresponding positive edge or negative edge of the corresponding pulse of the corresponding one of the clocks CK1 to CK4

(2) Digitize, for each pulse of the pulse signal PA, the number of delay units DU through which the corresponding pulse of the pulse signal PA has passed in accordance with the obtained phase difference, thus outputting the digitized value as a corresponding one of the z-bit data O1 to the z-bit data O4.

Digitization of the phase difference between the positive edge or negative edge of each pulse of the pulse signal PA and the corresponding positive edge or negative edge of the corresponding pulse of the corresponding one of the clocks CK1 to CK4 makes it possible to eliminate the latch-subtractor modules 35 to 38 (latches 41 to 44 and the subtractors 51 to 54), resulting in the configuration of the pulse position digitizing circuit 304 being simpler. That is, the z-bit data O1 to the z-bit data O4 are directly transferred from the respective encoders 31 to 34 to the adder 5 as digital numeric data items DT1 to DT4.

The remaining configuration of the A/D converter 301 according to the third embodiment is substantially identical to that of the A/D converter 1 or 1A according to the first or second embodiment, descriptions of the remaining configuration of the A/D converter 301 being omitted.

As descried above, the encoder unit 360 according to the third embodiment is comprised of only the encoders 31 to 34, reducing the number of components constituting the encoder unit 360 as compared with the number of components constituting the encoder unit 60 according to each of the first and second embodiments. This therefore results in a smaller footprint of the encoder unit 360 as compared with a footprint of the encoder unit 60 according to each of the first and second embodiments.

As described above, the pulse delay circuit 302 of the A/D converter 301 according to the third embodiment is comprised of the n delay units DU that are designed to constitute an open delay line.

This configuration of the A/D converter 301 according to the third embodiment, which achieves the same advantageous benefits as described in the first embodiment, eliminates the need of components, such as NAD gate and subtractors, required for the n delay units DU being designed as a ring delay line. This therefore results in a further reduction in size of the A/D converter 301 and in further efficient improvement of the pulse-delay characteristics of the A/D converter 301.

Modifications

The present disclosure is however not limited to the above first to third embodiments, and can be variously modified or expanded as follows.

Although each of the NOT gates G2 to Gn according to each of the first and second embodiments is comprised of a single-stage CMOS inverter, each of the NOT gates G2 to Gn according to the present disclosure can be comprised of two-stage CMOS inverters cascade-connected to one another.

This modification reduces the dispersion in the digital numeric data item DTA obtained by plural A/D conversion operations carried out by the A/D converter 1 or 1A as compared with each of the NOT gates G2 to Gn being comprised of a single-stage CMOS inverter.

Each of the A/D converters 1, 1A, and 301 according to the first to third embodiments is configured such that the clock CK1, which is selected from the clocks CK1 to CKm (m=4), is commonly inputted to all the secondary latches 21s to 24s or 221s to 224s as the second clock, but the present disclosure is not limited thereto.

Specifically, plural clocks, such as the clocks CK1 and CK2, can be selected from the clocks CK1 to CKm (m=4) as the second clocks, and each of the selected clocks can be commonly inputted to at least two of the secondary latches 21s to 24s or 221s to 224s as the second clock.

For example, the clocks CK1 and CK2 can be selected from the clocks CK1 to CKm (m=4) as the second clocks, and the clock CK1 can be commonly inputted to the secondary latches 21s and 22s or 221s and 222s, and the clock CK2 can be commonly inputted to the secondary latches 23s and 24s or 223s and 224s.

Additionally, a first selected clock, such as the clock CK1, from the clocks CK1 to CKm (m=4) can be commonly inputted to the (m−1) secondary latches, such as the secondary latches 21s, 22s, and 23s, and a second selected clock, such as the clock CK2, from the clocks CK1 to CKm (m=4) can be commonly inputted to the remaining secondary latch, such as the secondary latch 24s.

Specifically, a selected clock, such as the clock CK1, can be inputted to a maximum of (m−1) secondary latches.

The primary latches 21m to 24m for each delay unit DU are configured to latch the state of the delayed pulse outputted from the corresponding delay unit DU through the NOT gate 20 at the sample times corresponding to the respective pulses of the different clocks CK1, CK2, CK3, and CK4. Additionally, each of the secondary latches 21s to 24s is configured to latch the output of the corresponding one of the primary latches 21m to 24m at the sample time corresponding to the occurrence of each pulse of the clock CK1.

Each of the secondary latches 21s to 24s can be configured to latch the output of the corresponding one of the primary latches 21m to 24m at the sample time corresponding to the occurrence of each pulse of a reference clock, which is generated based on at least one of the clocks CK1 to CK4, used as the second clock. That is, any one of the clocks CK1 to CK4 can be subjected to any pulse-shaping process, such as a pulse inversion process, and thereafter can be used as the second clock.

To sum up, each of the A/D converters according to the present disclosure can be configured such that (1) The second clock, which is generated based on the first clock, is commonly inputted to at least first and second secondary latches, such as the secondary latches 21s and 22s, selected from the secondary latches 21s to 24s

(2) The at least first and second secondary are each configured to latch, at the sample time corresponding to the occurrence of each pulse of the second clock, the output data items outputted from at least first and second primary latches, such as primary latches 21m and 22m, corresponding to the respective at least first and second secondary latches Reducing the phase difference Δt between each adjacent pair of the clocks CK1, CK2, CK3, and CK4 enables the number m of the latch modules 21 to 24 (m=4) parallelly connected to one another and provided for each delay unit DU to increase. The larger the number m of the latch modules 21 to 24 (m=4) parallelly connected to one another and provided for each delay unit DU, the higher the obtained resolution and accuracy of the digital numeric data item DTA.

As described in the patent publication No. 2004-007385, a circulation-number counter can be provided subsequently to the pulse delay circuit 2. The circulation-number counter is configured to count the number of times the pulse signal has circulated through the pulse delay circuit 2.

Each of the subtractors 51 to 54 according to this modification can be configured to subtract, as present code data, corresponding one of the code data O1, code data O2, code data O3, and code data O4 outputted from the encoders 31, 32, 33, and 34 at the sample time corresponding to the occurrence of each pulse of the sampling clock reference signal CKs from the previous code data stored in the corresponding one of the latches 41 to 44 in accordance with the counted number to thereby calculate the deviation data between the present code data and the previous code data. Then, each of the subtractors 51 to 54 can be configured to output, to the adder 5, the deviation data as corresponding one of the digital numeric data items DT1 to DT4.

The configurations and/or functions of the first to third embodiments can be combined with each other. A modified embodiment, which is created by eliminating a part of a selected one of the first to third embodiments, can be regarded as an embodiment of the present disclosure as long as the modified embodiment can solve the above problem and lie within the scope of the present disclosure.

Various inventive applications, which can be considered within the scope of the present disclosure, can be regarded as embodiments of the present disclosure.

While illustrative embodiments of the present disclosure have been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. An analog-to-digital converter comprising:
 a pulse delay circuit that includes a plurality of delay units connected in series to one another, the pulse delay circuit being configured to transfer a pulse signal therethrough while the pulse signal is delayed by each of the plurality of delay units, a delay time of each of the plurality of delay units depending on a level of an analog input signal being input to each of the plurality of delay units; and a plurality of latch modules provided for each of the delay units, each of the latch modules provided for each of the delay units comprising:

a plurality of primary latches configured to respectively latch an output of the corresponding one of the delay units at respective sample times of different first clocks;

a plurality of secondary latches for latching outputs of the respective primary latches, the plurality of secondary latches including at least first and second secondary latches, the plurality of primary latches including at least first and second primary latches respectively corresponding to the at least first and second secondary latches, each of the at least first and second secondary latches being configured to latch, at a sample time of a common second clock, the output of a corresponding one of the at least first and second primary latches, the common second clock being based on at least one of the first clocks; and an encoder unit configured to encode an output data item outputted from each of the plurality of secondary latches into a digital numeric data item.

2. The analog-to-digital converter according to claim 1, wherein:

each of the plurality of primary latches is cascade-connected to a corresponding one of the plurality of secondary latches.

3. The analog-to-digital converter according to claim 1, wherein:

the plurality of primary latches included in each of the latch modules are each designed as a static circuit that: includes a feedback loop; and is configured to latch the output of the corresponding one of the delay units; and the plurality of secondary latches included in each of the latch modules are each designed as a dynamic circuit that is configured to latch the output of the corresponding one of the plurality of primary latches.

4. The analog-to-digital converter according to claim 1, wherein:

the plurality of delay units are connected in series to one another in a ring form, so that the pulse delay circuit is configured as a ring delay line.

5. The analog-to-digital converter according to claim 1, wherein:

the plurality of delay units are connected in series to one another in a non-loop form, so that the pulse delay circuit is configured as an open delay line.

6. The analog-to-digital converter according to claim 1, wherein:

the common second clock is configured to be inputted to all the plurality of secondary latches; and each of the plurality of secondary latches is configured to latch, at the sample time of the common second clock, the output of the corresponding one of the plurality of primary latches.

7. The analog-to-digital converter according to claim 1, wherein:

the encoder unit comprises a plurality of encoders each configured to read, in response to a master clock, the output data item outputted from a corresponding one of the plurality of secondary latches into the digital numeric data item; and at least one of the first clocks and the second clock is generated based on the master clock.

* * * * *